US008138958B2

(12) United States Patent
Dai et al.

(10) Patent No.: US 8,138,958 B2

(45) Date of Patent: Mar. 20, 2012

(54) VERNIER RING TIME-TO-DIGITAL CONVERTERS WITH COMPARATOR MATRIX

(75) Inventors: Fa Foster Dai, Auburn, AL (US); Jianjun Yu, Auburn, AL (US)

(73) Assignee: Auburn University, Auburn, AL (US)

( * ) Notice: Subject to any disclaimer, the term of this patent is extended or adjusted under 35 U.S.C. 154(b) by 204 days.

(21) Appl. No.: 12/697,111

(22) Filed: Jan. 29, 2010

(65) Prior Publication Data

US 2010/0283653 A1 Nov. 11, 2010

Related U.S. Application Data

(60) Provisional application No. 61/206,408, filed on Jan. 30, 2009, provisional application No. 61/180,638, filed on May 22, 2009.

(51) Int. Cl.
*H03M 1/12* (2006.01)

(52) U.S. Cl. ........................................ 341/155; 341/169

(58) Field of Classification Search .................. 341/155, 341/166, 169, 154, 165; 327/105, 262

See application file for complete search history.

(56) References Cited

U.S. PATENT DOCUMENTS

| | | | | |
|---|---|---|---|---|
| 7,782,242 B2 * | 8/2010 | Rivoir | .......................... | 341/166 |
| 7,830,191 B2 * | 11/2010 | Kojima et al. | ................ | 327/262 |
| 2008/0069292 A1 * | 3/2008 | Straayer et al. | ................ | 377/46 |
| 2010/0308871 A1 * | 12/2010 | Helio et al. | .................. | 327/105 |

* cited by examiner

*Primary Examiner* — Peguy Jean Pierre

(74) *Attorney, Agent, or Firm* — Haverstock & Owens LLP

(57) ABSTRACT

A time to digital converter (TDC) is able to be utilized for measuring a time interval between two signals with a very fine time resolution, which is defined as the difference in propagation delay per stage between two rings or chains of delay stages. The Vernier ring TDC, Vernier TDC with comparator matrix or Vernier ring TDCs with comparator matrix comprise two rings or chains of delay stages with slightly different propagation delays per stage and a plurality of comparators for comparing two signals propagation along two rings or chains and determining when the lag signal passes the lead signal. The lead and lag signal are initiated by two events and are each fed into a separate one the first stages of one of the specified rings or chains. The comparators are able to be organized in a comparator matrix in order to occupy less space and permit reuse. As a result, the input time interval (the time between the two initiating events) is able to be measured through the product of the time resolution and the number of stages through which the two signals propagated.

79 Claims, 17 Drawing Sheets

400

VERNIER RING TIME-TO-DIGITAL CONVERTERS WITH COMPARATOR MATRIX

CROSS-REFERENCE TO RELATED APPLICATIONS

This application claims priority from U.S. Provisional Patent Application Ser. No. 61/206,408, filed Jan. 30, 2009 and entitled VERNIER RING TIME-TO-DIGITAL CONVERTER, which is hereby incorporated herein by reference in its entirety for all purposes. This application also claims priority from U.S. Provisional Patent Application Ser. No. 61/180,638, filed May 22, 2009 and entitled N-DIMENSIONAL VERNIER TIME-TO-DIGITAL CONVERTER, which is hereby incorporated herein by reference in its entirety for all purposes.

U.S. GOVERNMENT AGENCY AND THE GOVERNMENT CONTRACT

The invention was partially funded by an agency of the United States Government or under a contract with an agency of the United States Government. The name of the U.S. Government agency and the Government contract number are: Army Research Laboratory under Contract No. W911 QX-05-C-0003.

FIELD OF THE INVENTION

The present invention relate to time-to-digital converters (TDCs). More particularly, the invention relates to Vernier ring TDCs, Venier ring TDCs with a comparator matrix, Vernier TDCs with comparator matrixes and n-dimensional Vernier ring TDCs with a comparator matrix and Venier TDCs with comparator matrixes.

BACKGROUND OF THE INVENTION

TDCs are used to measure the time interval between two events by a small quantization step that creates a time resolution. High resolution TDCs have become increasingly popular for time-of-flight measurement, jitter measurement, clock data recovery, measurement and instrumentation, and digital phase-locked loops. Time resolution, detectable range, measurement time, power consumption and die area are most important concerns in TDC designs. Similar to any other analog to digital converter, the quantization step is the major parameter of TDC that determines the system performance in all the applications stated above. Time resolution has previously been limited by the propagation delay of the inverter and therefore has become a critical criteria in the assessment of TDC design.

A prior art delay line based TDC 100 is illustrated in FIG. 1. The delay line based TDC 100 comprises a few delay stages 102 and D flip-flops (DFFs) 104. The DFFs are coupled in series down a first delay line 106, and the DFFs are coupled to the output of each delay stage 102 and to an input line 108. In operation a first event signal is propagated down the delay line 106 such that it is slowed down by each delay stage 102 before reaching an input of each DFF 104. Each delay stage 102 will cause the first event signal to repeat the logical "01" or "10" transition after imposing a certain amount of delay on the signal. The second event signal then triggers all the DFFs 104 to sample the outputs of all delay stages 102 causing the DFFs 104 to output a logical 1 until the second event signal passes the first event signal. These sampled values, which are output along an output line 110 are then summed up to a number N. As a result, the measured time interval between these two event signals is able to be calculated using $$Tin=N*t_{delay}$$

where the $t_{delay}$ is the delay of a single delay stage 102. The drawback of these delay line based TDCs 100 is their large quantization steps (time resolution), which cannot be reduced easily.

The Vernier delay line 200 shown in FIG. 2, although substantially similar to the delay line described above, is one popular technique for TDCs to improve the time resolution. In this case, the first event signal again propagates through a slow delay line 206 comprising a number of delay stages 202A, however this time the second event signal propagates through a fast delay line 208 also having a number of delay stages 202B. The fast delay line 208 has a propagation delay per stage of $t_f$ and the slow delay line 206 has a propagation delay per stage of $t_S$. Each DFF 204 will output a logical 1 once the second event signal arrives earlier than the first event signal to the inputs of the DFF 204. Otherwise the DFF 204 outputs a logical 0. Thus, in this case the time interval between the first and second event signals is given by $$Tin=N*\Delta t=N*(t_f-t_S)$$

where Δt is much less than both $t_f$ and $t_S$. Due to the improved time resolution, the Vernier delay line (VDL) TDC 200 needs a significantly larger amount of stages 202A, 202B, has a longer measurement time and requires larger power consumption in order to quantize the given time interval. Therefore, the prior art VDL TDC 200 has small detectable range and must occupy a large area, which limit its application.

SUMMARY OF THE INVENTION

The present application is directed to a TDC for measuring a time interval with a very fine time resolution, which is defined as the difference in propagation delay per stage between two rings or chains of delay stages. The Vernier ring TDC, Vernier TDC with comparator matrixes or Vernier ring TDC with comparator matrix comprise two rings or chains of delay stages with slightly different propagation delays per stage and a plurality of comparators for comparing two signals propagation along two rings or chains and determining when the lag signal passes the lead signal. The lead and lag signal are initiated by two events and are each fed into a separate one of the first stages of one of the specified rings or chains. The comparators are able to be organized in a comparator matrix in order to occupy less space and permit reuse. As a result, the input time interval (the time between the two initiating events) is able to be measured through the product of the time resolution and the number of stages through which the two signals are propagated.

One aspect of the present application is directed to a ring time-to-digital converter. The converter comprises a lead initiating stage for receiving a lead step signal and a lag initiating stage for receiving a lag step signal, a plurality of serially coupled lead delay stages for enabling propagation of the lead step signal, wherein a last lead delay stage in the series is coupled to an input of the lead initiating stage and a first lead delay stage is coupled to an output of the lead initiating stage thereby forming a lead ring and a plurality of serially coupled lag delay stages for enabling propagation of the lag step signal, wherein a last lag delay stage is coupled to an input of the lag initiating stage and a first lag delay stage is coupled to an output of the lag initiating stage thereby forming a lag ring, wherein each lead delay stage has a corresponding lag delay stage. The lead step signal propagates from the lead initiating stage along the lead ring and the lag step signal propagates from the lag initiating stage along the lag ring. Each lead delay stage has an adjustable lead propagation delay interval that is greater than an adjustable lag propagation delay interval of each lag delay stage such that after each stage a lag rising and lag falling edge of the lag signal begins to catch up with a lead rising and lead falling edge of the lead signal. In some embodiments, the converter comprises a plurality of comparator pairs, wherein each pair is coupled to a lead output of a lead delay stage and a lag output of the corresponding lag delay stage. The plurality of comparator pairs each comprise an A-type comparator for detecting a lead or lag rising edge and a B-type comparator for detecting a lead or lag falling edge. The outputs of the A-type comparators toggle between a logical one and a logical zero when the lag rising edge arrives before the lead rising edge, and outputs of the B-type comparators toggle between a logical one and a logical zero when the lag falling edge arrives before the lead falling edge. The comparators comprise any combination of singled-ended or differential arbiters, flip flops and latches. Alternatively, the converter comprises a plurality of double-edge-triggered comparators, wherein each comparator is coupled to a lead output of a lead delay stage and a lag output of the corresponding lag delay stage, and further wherein the outputs of the comparators toggle between a logical one and a logical zero when either the lag rising edge arrives before the lead rising edge or the lag falling edge arrives before the lead falling edge. In some embodiments, the delay stages comprise any combination of inverters, buffers and any other type of logic gate. In some embodiments, initiating stages comprise any combination of NAND gates, multiplexers, multi-switches and any other type of logic gate.

A second aspect of the present application is directed to a ring time-to-digital converter system. The converter system comprises a Vernier ring comprising a lead initiating stage for receiving a lead step signal and a lag initiating stage for receiving a lag step signal, a plurality of serially coupled lead delay stages for enabling propagation of the lead step signal, wherein a last lead delay stage is coupled to an input of the lead initiating stage and a first lead delay stage is coupled to an output of the lead initiating stage thereby forming a lead ring and a plurality of serially coupled lag delay stages for enabling propagation of the lag step signal, wherein a last lag delay stage is coupled to an input of the lag initiating stage and a first lag delay stage is coupled to an output of the lag initiating stage thereby forming a lag ring, wherein each lead stage has a corresponding lag stage. In some embodiments, the lead step signal propagates from the lead initiating stage along the lead ring and the lag step signal propagates from the lag initiating stage along the lag ring. In some embodiments, each lead delay stage has an adjustable lead propagation delay interval that is greater than an adjustable lag propagation delay interval of each lag delay stage such that after each stage a lag rising and lag falling edge of the lag signal begins to catch up with a lead rising and lead falling edge of the lead signal. The converter system further comprises a plurality of comparator pairs, wherein each pair is coupled to a lead output of a lead delay stage and a lag output of the corresponding lag delay stage. In some embodiments, the plurality of comparator pairs each comprise an A-type comparator for detecting a lead or lag rising edge and a B-type comparator for detecting a lead or lag falling edge. In some embodiments, outputs of the A-type comparators toggle between a logical one and a logical zero when the lag rising edge arrives before the lead rising edge, and outputs of the B-type comparators toggle between a logical one and a logical zero when the lag falling edge arrives before the lead falling edge. Alternatively, the converter further comprises a plurality of double-edge-triggered comparators, wherein each comparator is coupled to a lead output of a lead delay stage and a lag output of the corresponding lag delay stage, wherein outputs of the comparators toggle between a logical one and a logical zero when either the lag rising edge arrives before the lead rising edge or the lag falling edge arrives before the lead falling edge. In some embodiments, the converter system further comprises pre-logic coupled to the lead and lag initiating stages for receiving a pair of input signals, determining which input signal arrived first, and outputting the signal that arrived first to the lead initiating stage as the lead signal and the signal that arrived second to the lag initiating stage as the lag signal. The pre-logic comprises a pre-logic comparator and a pair of multiplexers. In some embodiments, the pre-logic is further coupled to an evaluation logic for outputting a sign bit to the evaluation logic. In some embodiments, the converter system further comprises control logic, wherein the control logic resets one of the comparators in each of the pairs of comparators every other time the lead step signal laps the lead ring. In some embodiments, the converter system further comprises a fine counter, wherein the fine counter is incremented each time the lead signal laps the lead ring. In some embodiments, the converter system further comprises a coarse counter, wherein the coarse counter is incremented each time the lead signal laps the lead ring before the lag signal arrives at the lag initiating stage. In some embodiments, the converter system further comprises a thermometer decoder coupled to outputs of the pairs of comparators for translating the output of the pairs of comparators from thermometer code to binary code. The evaluation logic is coupled to an output of the coarse counter, the fine counter, the thermometer decoder and the sign bit output by the pre-logic, for determining a time interval between the lead signal and the lag signal. In some embodiments, the lead initiating stage comprises one of the lead delay stages and the lag initiating stage comprises one of the lag delay stages such that the lead and lag initiating stages are able to both initiate and delay the lead and lag signals.

A third aspect of the present application is directed to a method of measuring a time interval. The method comprises directing a lead signal to a lead initiating stage and a lag signal to a lag initiating stage, then outputting a sign bit, propagating the lead signal through a lead ring comprising a plurality of serially coupled lead delay stages, propagating the lag signal through a lag ring comprising a plurality of serially coupled lag delay stages, wherein each lead delay stage has a corresponding lag delay stage, determining a first number of laps through the lead ring the lead signal has propagated when the lag signal arrives at the lag initiating stage, determining at which lead delay stage and corresponding lag delay stage the lag signal passes the lead signal and recording a second number of laps around the lead ring the lead signal has propagated before the lead delay stage and corresponding lag delay stage and calculating the time interval between the lead and lag signals. In some embodiments, the method further comprises receiving a pair of input signals and determining the lead signal and the lag signal, wherein the lead signal arrived before the lag signal. The last lead delay stage in the series is coupled to an input of the lead initiating stage and the first lead delay stage in the series is coupled to an output of the lead initiating stage thereby forming the lead ring and wherein the last lag delay stage in the series is coupled to an input of the lag initiating stage and the first lag delay stage in the series is coupled to an output of the lag initiating stage thereby forming the lag ring. Each lead delay stage has an adjustable lead propagation delay interval that is greater than an adjustable lag propagation delay interval of each lag delay stage such that after each stage a lag rising and lag falling edge of the lag signal begins to catch up with a lead rising and lead falling edge of the lead signal. In some embodiments, determining at which lead and corresponding lag stage the lag signal passes the lead signal comprises determining an arrival sequence of the lead and lag signals at a plurality of pairs of comparators coupled to each lead stage and the corresponding lag stage. In some embodiments, the method further comprises control logic, wherein the control logic resets one of the comparators in each of the plurality of pairs of comparators every other time the lead step signal laps the lead ring. In some embodiments, determining a first number of laps through the lead ring the lead signal has propagated when the lag signal arrives at the lag initiating stage further comprises incrementing a coarse counter each time the lead signal laps the lead ring. In some embodiments, determining at which lead and corresponding lag stage the lag signal passes the lead signal and recording a second number of laps around the lead ring the lead signal had propagated before the lead delay stage and corresponding lag delay stage further comprises incrementing a fine counter each time the lead signal laps the lead ring. In some embodiments, the method further comprises translating an output of the pairs of comparators from thermometer code to binary code with a thermometer decoder. In some embodiments, the method further comprises disconnecting the lead ring and the lag ring after the lag signal passes the lead signal.

Another aspect of the present application is directed to a time-to-digital converter. The converter comprises a plurality of first delay lines comprising a plurality of serially coupled first delay stages, a plurality of second delay lines comprising a plurality of serially coupled second delay stages, wherein each first delay line has a corresponding second delay line, a plurality of comparators wherein each comparator is coupled to a first output of one of the first delay stages from one of the first delay lines and a second output of one of the second delay stages from the corresponding second delay lines thereby forming a plurality of matrixes and a third delay line comprising a plurality of serially coupled third delay stages, wherein each of the third delay stages is coupled between inputs of the plurality of second delay lines and each of the matrixes. In some embodiments, the first delay stages are sequentially numbered along the first line and second delay stages are sequentially numbered along the second line. In some embodiments, each matrix comprises a plurality of comparator columns wherein a first column of the plurality of columns comprises a plurality of first comparators wherein each first comparator is coupled to the output of a first delay stage having a first number and the output of a second delay stage of an equal number, and further wherein a second column of the plurality of columns comprises a plurality of second comarators wherein each second comparator is coupled to the output of a first delay stage having a second number and the output of a second delay stage having a number that is greater than the second number by one. In some embodiments, an nth column of the plurality of columns comprises a plurality of nth comparators wherein each nth comparator is coupled to the output of a first delay stage having a third number and the output of a second delay stage having an nth number that is greater than the third number by (n−1). In some embodiments, the first delay stages have an adjustable first delay interval, the second delay stages have an adjustable second delay interval and the third delay stages have an adjustable third delay interval, and further wherein the first delay interval is less than the second delay interval which is less than the third delay interval. In some embodiments, the third delay interval is equal to the second delay interval multiplied by the number of second delay stages in one of the plurality of second delay lines minus the first delay interval multiplied by the number of first delay stages in one of the plurality of first delay lines. In some embodiments, the second delay interval is equal to the difference between the first and second delay intervals multiplied by the number of first delay stages in one of the plurality of first delay lines. In some embodiments, the third delay line and the initial one of the second delay lines are configured to receive a lead signal, and the first delay lines are configured to receive a lag signal, wherein the lead signal is ahead of the lag signal. The remainder of the second delay lines are configured to receive the lead signal as the lead signal propagates through each third stage of the third delay line.

Another aspect of the present application is directed to a time-to-digital converter. The converter comprises a lead initiating stage for receiving a lead step signal and a lag initiating stage for receiving a lag step signal, a plurality of serially coupled lead delay stages, wherein a last lead delay stage is coupled to an input of the lead initiating stage and a first lead delay stage is coupled to an output of the lead initiating stage thereby forming a lead ring and a plurality of serially coupled lag delay stages, wherein a last lag delay stage is coupled to an input of the lag initiating stage and a first lag delay stage is coupled to an output of the lag initiating stage thereby forming a lag ring, a plurality of comparators wherein each comparator is coupled to a lag output of one of the lag delay stages and a lead output of one of the lead delay stages thereby forming a matrix and a lap counter configured to count the number of laps that the lead signal has propagated through the lead ring before the lag signal passes the lead signal and before the lag signal arrives at the lag initiating stage. In some embodiments, the initiating stages comprise any combination of NAND gates, multiplexers, multi-switches or any other type of logic gate able to initiate the propagation of signals. In some embodiments, the delay stages comprise any combination of single-ended or differential inverters, buffers or any other type of logic gate able to delay and/or toggle the propagating signals. In some embodiments, the comparators comprise any combination of single-ended or differential arbiters, flip flops, latches or any other type of comparator. In some embodiments, the lag delay stages are sequentially numbered along the lag ring and lead delay stages are sequentially numbered along the lead ring. In some embodiments, the matrix comprises a plurality of comparator columns wherein a first column of the plurality of columns comprises a plurality of first comparators wherein each first comparator is coupled to the output of a lag delay stage having a first number and the output of a lead delay stage of an equal number, and further wherein a second column of the plurality of columns comprises a plurality of second comarators wherein each second comparator is coupled to the output of a lag delay stage having a second number and the output of a lead delay stage having a number that is greater than the second number by one. An nth column of the plurality of columns comprises a plurality of nth comparators wherein each nth comparator is coupled to the output of a lag delay stage having a third number and the output of a lead delay stage having an nth number that is greater than the third number by (n−1). In some embodiments, each lead delay stage has an adjustable lead propagation delay interval that is greater than an adjustable lag propagation delay interval of each lag delay stage such that after each stage a lag rising and lag falling edge of the lag signal begins to catch up with a lead rising and lead falling edge of the lead signal. In some embodiments, the comparators are grouped in order to form a plurality of comparator pairs, and further wherein both comparators in each comparator pair are coupled to the same lag output of one of the lag delay stages and the same lead output of one of the lead delay stages thereby forming the matrix. In some embodiments, the plurality of comparator pairs each comprise an A-type comparator for detecting the lead or lag rising edge and a B-type comparator for detecting the lead or lag falling edge. In some embodiments, outputs of the A-type comparators toggle between a logical one and a logical zero when the lag rising edge arrives before the lead rising edge, and outputs of the B-type comparators toggle between a logical one and a logical zero when the lag falling edge arrives before the lead falling edge. In some embodiments the converter further comprises a second lap counter, wherein the second lap counter is configured to count the number of laps that the lag signal has propagated through the lag ring before the lag signal passes the lead signal. In some embodiments, the converter further comprises a plurality of double-edge-triggered comparators, wherein each comparator is coupled to a lead output of a lead delay stage and a lag output of the corresponding lag delay stage. In some embodiments, outputs of the comparators toggle between a logical one and a logical zero when either the lag rising edge arrives before the lead rising edge or the lag falling edge arrives before the lead falling edge. In some embodiments, the lead propagation delay interval is equal to the difference between the lead and lag propagation delay intervals multiplied by the number of lag delay stages in the lag delay ring. In some embodiments, the lead initiating stage comprises one of the lead delay stages and the lag initiating stage comprises one of the lag delay stages such that the lead and lag initiating stages are able to both initiate and delay the lead and lag signals.

Yet another aspect of the present application are directed to an n-dimensional time-to-digital converter with comparator matrixes. The converter comprises a first delay line of an nth dimension comprising a plurality of serially coupled first delay stages, a second delay line of the nth dimension comprising a plurality of serially coupled second delay stages and a plurality of n−1 dimensional time-to-digital converters with comparator matrixes each having a lead signal input and a lag signal input, wherein the lead signal inputs are coupled to the second delay line such that one lead signal input is coupled before and after each second delay stage, and further wherein the lag signal inputs are coupled to the first delay line such that one lag signal input is coupled before and after each first delay stage. In some embodiments, the first delay stages have an adjustable first delay interval, the second delay stages have an adjustable second delay interval, and further wherein the first delay interval is less than the second delay interval. In some embodiments, the n−1 dimensional converters further comprise an n−1 delay interval, wherein the n−1 delay interval is equal to the difference between the first interval and the second interval.

Another aspect of the present application is directed to an n-dimensional ring time-to-digital converter with a comparator matrix. The converter comprises a lead initiating stage of an nth dimension for receiving a lead step signal and a lag initiating stage of the nth dimension for receiving a lag step signal, a plurality of serially coupled lead delay stages of the nth dimension, wherein a last lead delay stage is coupled to an input of the lead initiating stage and a first lead delay stage is coupled to an output of the lead initiating stage thereby forming a lead ring and a plurality of serially coupled lag delay stages of the nth dimension, wherein a last lag delay stage is coupled to an input of the lag initiating stage and a first lag delay stage is coupled to an output of the lag initiating stage thereby forming a lag ring, a lap counter of an nth dimension configured to count a number of laps that the lead step signal has propagated through the lead ring before the lag signal passes the lead signal and before the lag signal arrives at the lag initiating stage and a plurality of n−1 dimensional ring time-to-digital converters with a comparator matrix each having a lead signal input and a lag signal input, wherein the lead signal inputs are coupled to the lead delay line such that one lead signal input is coupled before and after each lead delay stage, and further wherein the lag signal inputs are coupled to the lag delay line such that one lag signal input is coupled before and after each lag delay stage. In some embodiments, the lag delay stages have an adjustable lag delay interval, the lead delay stages have an adjustable lead delay interval, and further wherein the lag delay interval is less than the lead delay interval. In some embodiments, the n−1 ring matrix dimensional time-to-digital converters further comprise an n−1 delay interval, wherein the n−1 delay interval is equal to the difference between the lag interval and the lead interval.

Another aspect of the present application is directed to a method of measuring a time interval. The method comprises directing a lead signal to a lead initiating stage of the nth dimension and a lag signal to a lag initiating stage of the nth dimension, then outputting a sign bit of the nth dimension, propagating the lead signal through a lead ring of the nth dimension comprising a plurality of serially coupled lead delay stages, propagating the lag signal through a lag ring of the nth dimension comprising a plurality of serially coupled lag delay stages, wherein each lead delay stage has a corresponding lag delay stage, determining a first number of laps through the lead ring the lead signal has propagated when the lag signal arrives at the lag initiating stage, determining at which lead and corresponding lag delay stage the lag signal passes the lead signal and recording a second number of laps around the lead ring the lead signal has propagated before the lead delay stage and corresponding lag delay stage, calculating a n−1 time interval between the lead and lag signals, calculating a n time interval between the lead and lag signals and adding the n−1 time interval and the n time interval. In some embodiments, the last lead delay stage in the series is coupled to an input of the lead initiating stage and the first lead delay stage in the series is coupled to an output of the lead initiating stage thereby forming the lead ring and wherein the last lag delay stage in the series is coupled to an input of the lag initiating stage and the first lag delay stage in the series is coupled to an output of the lag initiating stage thereby forming the lag ring. In some embodiments, each lead delay stage has an adjustable lead propagation delay interval that is greater than an adjustable lag propagation delay interval of each lag delay stage such that after each stage a lag rising and lag falling edge of the lag signal begins to catch up with a lead rising and lead falling edge of the lead signal. In some embodiments, determining a first number of laps through the lead ring the lead signal has propagated when the lag signal arrives at the lag initiating stage further comprises incrementing a coarse counter each time the lead signal laps the lead ring. In some embodiments, determining at which lead and corresponding lag stage the lag signal passes the lead signal and recording a second number of laps around the lead ring the lead signal had propagated before the lead delay stage and corresponding lag delay stage further comprises incrementing a fine counter each time the lead signal laps the lead ring. In some embodiments, the method further comprises disconnecting the lead ring and the lag ring after the lag signal passes the lead signal.

Another aspect of the present application is directed to a method of measuring a time interval. The method comprises propagating the lag signal through a first delay line of the nth dimension comprising a plurality of serially coupled first delay stages, propagating the lead signal through a second delay line of the nth dimension comprising a plurality of serially coupled second delay stages, wherein each first delay stage has a corresponding second delay stage, propagating the lead and lag signal through a plurality of n−1 dimensional matrix time-to-digital converters each having a lead signal input and a lag signal input, determining at which first and corresponding second delay stage the lag signal passes the lead signal, calculating a n−1 time interval between the lead and lag signals, calculating a n time interval between the lead and lag signals and adding the n−1 time interval and the n time interval, wherein the lead signal inputs are coupled to the second delay line such that one lead signal input is coupled before and after each second delay stage, and further wherein the lag signal inputs are coupled to the first delay line such that one lag signal input is coupled before and after each first delay stage. In some embodiments, each first delay stage has an adjustable first propagation delay interval that is less than an adjustable second propagation delay interval of each second delay stage such that after each stage a lag rising and lag falling edge of the lag signal begins to catch up with a lead rising and lead falling edge of the lead signal.

Another aspect of the present application is directed to a method of measuring a time interval. The method comprises directing a lead signal to a lead initiating stage and a lag signal to a lag initiating stage, then outputting a sign bit, propagating the lead signal through a lead ring comprising a plurality of serially coupled lead delay stages, propagating the lag signal through a lag ring comprising a plurality of serially coupled lag delay stages, wherein each lead delay stage has a corresponding lag delay stage, detecting at which lap of propagation the lag signal passes the lead signal, determining a number of laps through the lead ring the lead signal has propagated and a number of laps through the lag ring the lag signal has propagated before the lag signal has passed the lead signal, disconnecting the lead ring and lag ring before a next lap starts after at least one converter detects that the lag signal has passed the lead signal, determining at which lead delay stage and corresponding lag delay stage the lag signal passes the lead signal by comparing results of a comparator matrix, calculating the time interval between lead signal and lag and restoring calculation results and resetting the system to be ready for the next measuring cycle. In some embodiments, the method further comprises control logic, wherein the control logic resets one of the comparators in each of the plurality of pairs of comparators every other time the lead step signal laps the lead ring.

DETAILED DESCRIPTION

Figure 1:
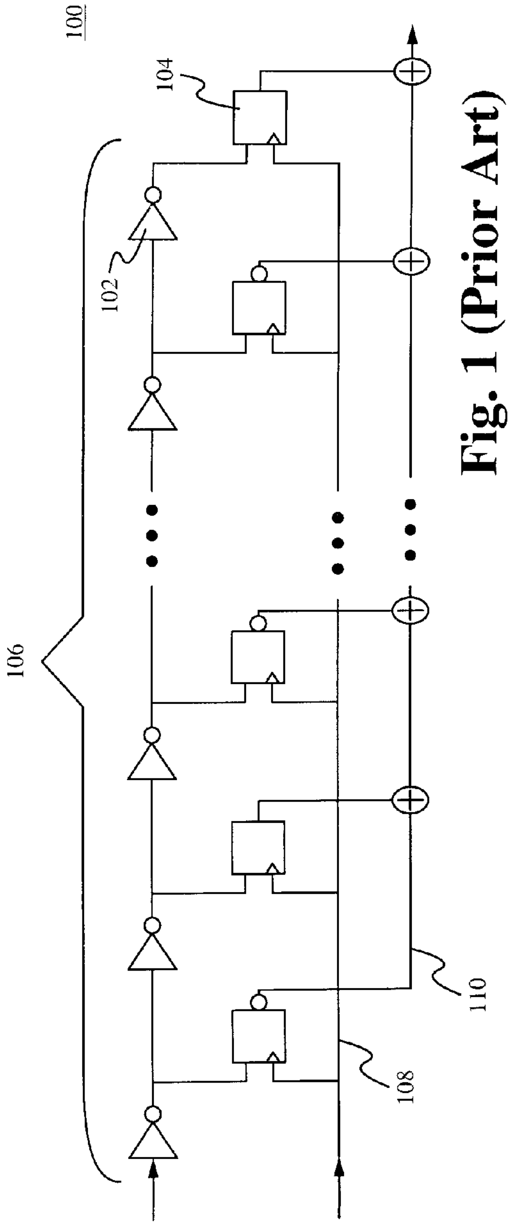
Fig. 1 (Prior Art)
FIG. 1 is directed to a prior art embodiment of a delay line based TDC with a buffer delay timing resolution.
Figure 2:
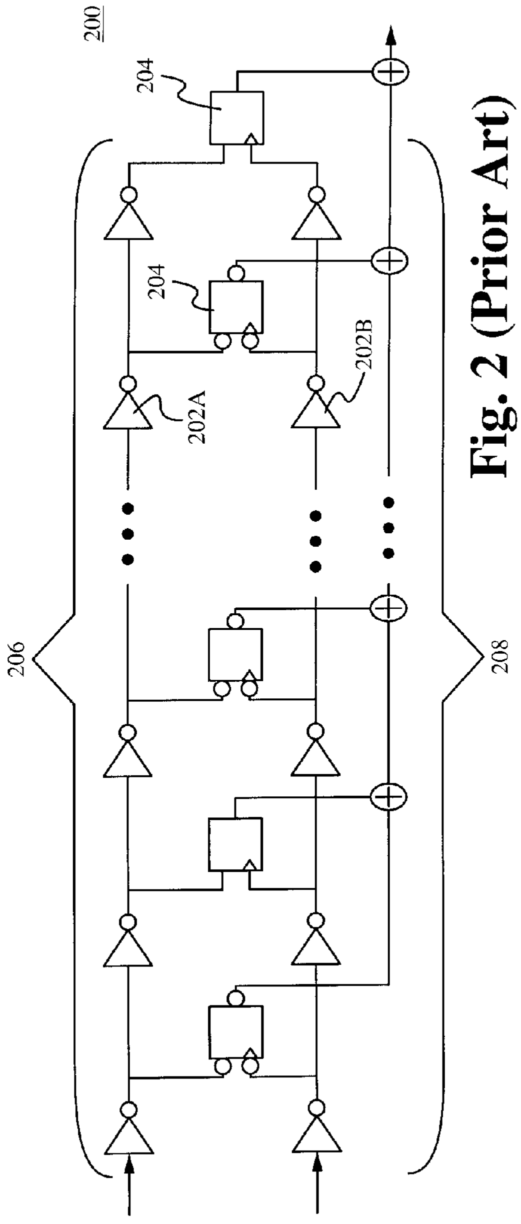
Fig. 2 (Prior Art)
FIG. 2 is directed to a prior art embodiment of a Vernier delay line based TDC with a sub-gate timing solution.
Figure 3:
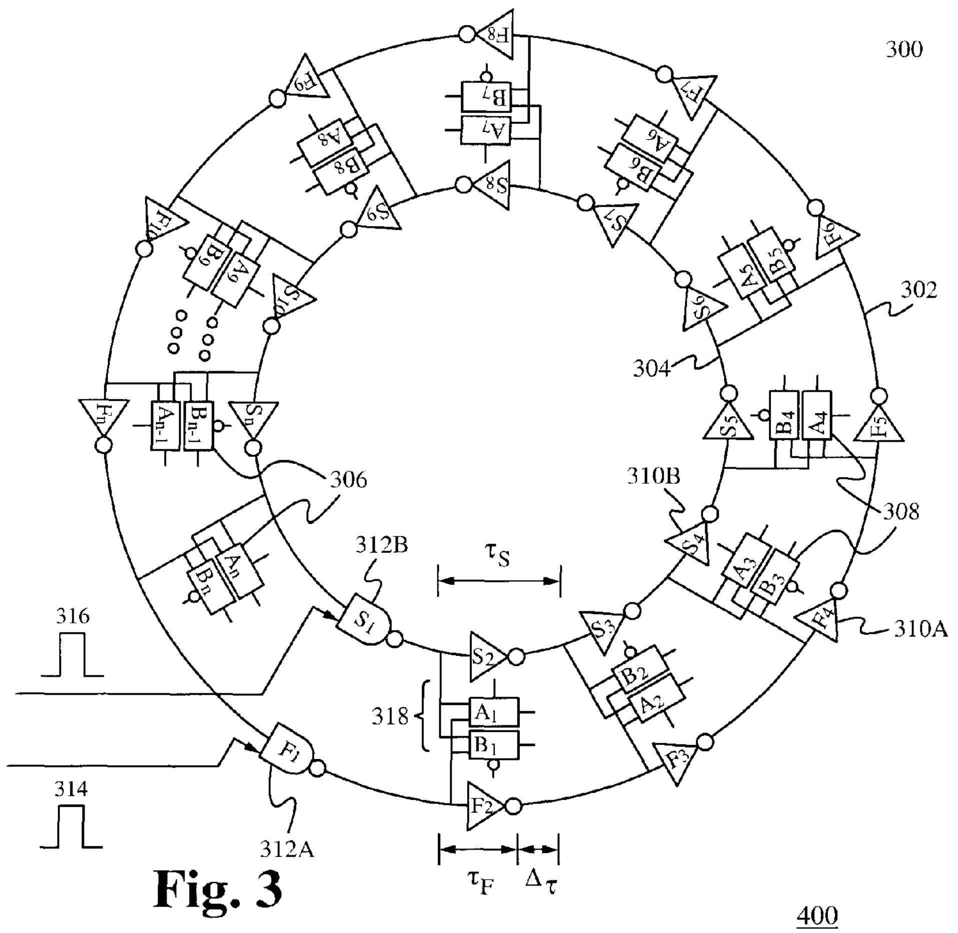
FIG. 3 is directed to a block diagram of a Vernier ring TDC in accordance with some embodiments of the present application.

FIG. 3 illustrates a block diagram of one embodiment of a Vernier ring TDC 300 which comprises a fast ring 302, a slow ring 304, an inner chain of arbiters 306 and an outer chain of arbiters 308. As shown in FIG. 3, the inner and outer chain of arbiters 306, 308 comprise two types of arbiters, type A and type B, which are placed alternatively along the two inverter rings 302, 304. Alternatively, any number of types of arbiters or comparators are able to be used including only one type. Arbiter type A is triggered by a logical rising edge "01" while arbiter B is triggered by a falling edge "10". In some embodiments, the arbiters are replaced with D flip-flops. Alternatively, the arbiters are able to be replaced by any type of comparator including flip flops and latches, either single-ended or differential, and other comparators well known in the art. Both rings 302, 304 comprise the same even number of delay stages 310A, 310B and a NAND gate 312A, 312B as an initiating stage of the rings 302, 304. Alternatively, any other type of logic gate, as are well known in the art, is able to be used as the initiating stages of the rings. In some embodiments, the initiating stages are able to be a combination of an initiating stage and a delay stage such that the initiating stages are able to both initiate and delay leading and lagging signals. It should be noted however that in such embodiments, the difference in delay between the initiating stages would be equal to the difference in delay between a delay stage from the slow ring and a delay stage from the fast ring. The fast and slow rings 302, 304, and inner and outer chains 306, 308 are able to comprise any number of arbiters and delay stages 310A, 310B. To illustrate this aspect, FIG. 3 shows the fast and slow rings 302, 304 ending only with the nth delay stages $S_n$ and $F_n$. Similarly, FIG. 3 shows arbiter chains 306, 308 ending with arbiters $A_n$ and $B_n$. In some embodiments, the delay stages 310A, 310B are inverters. Alternatively, the delay stages are able to be any logic device capable of delaying a signal as are well known in the art. The propagation delay of delay stages 310A, 310B in the fast and slow rings 302, 304 are set to $\tau_F$ and $\tau_S$, respectively. In some embodiments, the propagation delay of the delay stages 310A, 310B is adjustable. Thus, the time resolution is given by:

$$\Delta\tau=\tau_S-\tau_F.$$

In operation, a lead signal 316 is fed into the slow ring 304 through the slow initiating stage 312B. The lag signal 314 is fed into the fast ring 302 through the fast initiating stage 312A. Thus, due to the difference in the propagation delay of the delay stages in the fast ring 310A and the slow ring 310B, as discussed above, the lag signal 314 will chase the lead signal 316 around their respective rings 302, 304 and eventually pass the lead signal 316 after a certain amount of propagation. Every delay stage 310A from the outer ring 302 has a corresponding delay stage 310B from the inner ring 304 (e.g., $S_2$ and $F_2$). Further, each pair of delay stages 310A, 310B is connected with a pair of the arbiters 318 from the arbiter chains 306, 308. One from the inner arbiter chain 306 and one from the outer chain 308. Additionally, because the arbiter types A and B alternate in the chains, and the chains are offset relative to each other, every pair of delay stages will be coupled to one arbiter type A and one arbiter type B. In operation, as will be discussed in greater detail below in reference to FIG. 6, each arbiter pair 318 receives an output of one fast ring delay stage 310A and one slow ring delay stage 310B. The arbiter pairs then determine if the lag signal 314 arrived before the lead signal 316 and if so, output a signal indicating so. It should be noted, as will be discussed below and is well known in the art, because A type arbiters respond only to rising edges and B type arbiters only respond to falling edges, only one of the pair of arbiters will be activated by the passing lag and lead signals 314, 316 each lap depending on the orientation of the signals.

Figure 4:
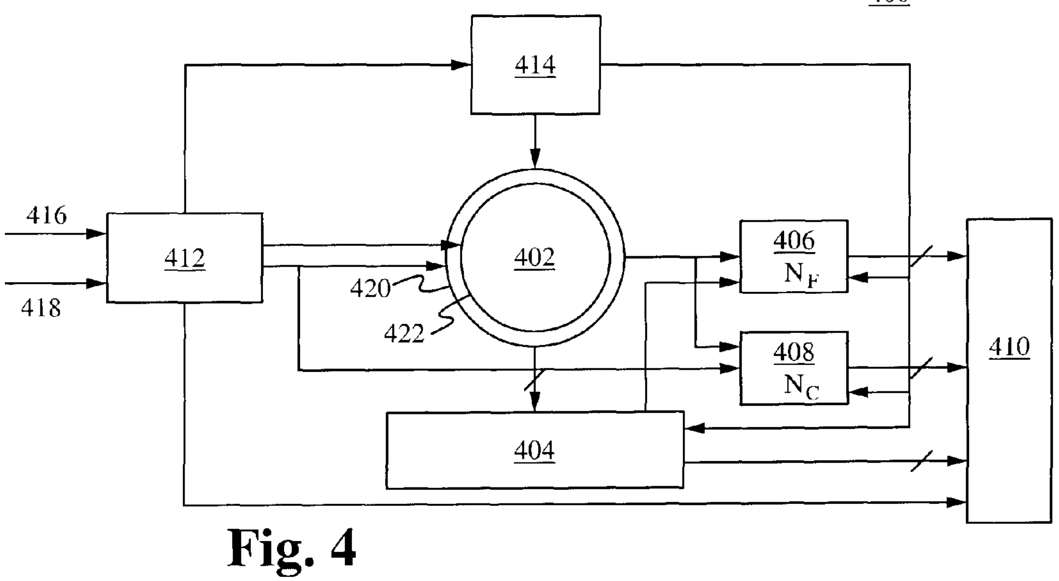
FIG. 4 is directed to a block diagram of a Vernier ring TDC system in accordance with some embodiments of the present application.
Figure 5:
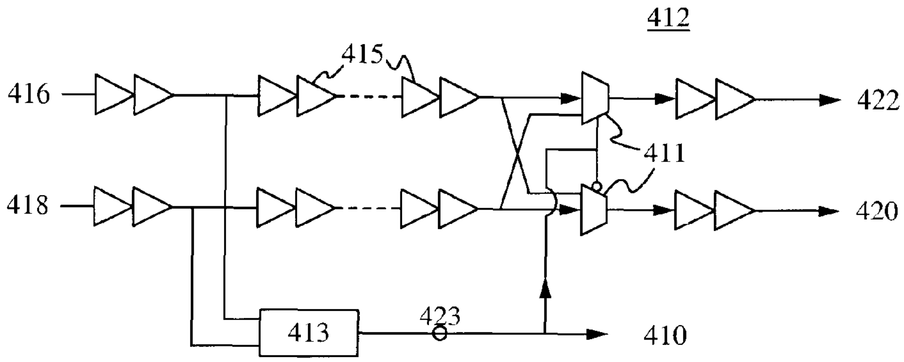
FIG. 5 is directed to a block diagram of a pre-logic cell of a Vernier ring TDC system in accordance with some embodiments of the present application.

FIG. 4 shows the block diagram of a Vernier ring TDC system 400 which includes a ring Vernier TDC 402, a thermometer decoder 404, a fine counter $N_F$ 406, a coarse counter $N_C$ 408, evaluation logic 410, pre-logic 412 and control logic 414. Similar to above, the ring Vernier TDC 402 comprises a fast ring 416 and a slow ring 408. In some embodiments, the system 400 comprises additional elements such as additional counters, thermometers and other logic elements as are well known in the art. As shown in FIGS. 4 and 5, the pre-logic 412 comprises an arbiter 413, a pair of multiplexers (MUXs) 411, a number of buffers 415, and two inputs for receiving two input signals, a reference signal 416 and a feedback signal 418. Alternatively, the pre-logic 412 is able to comprise any other combination of logic devices capable of determining a lead and a lag signal from a pair of received signals and outputting those signals and a sign bit 423.

The pre-logic 412 is coupled via outputs to the control logic 414, the fast 420 and slow 422 rings of the ring TDC 402, the coarse counter 408 and the evaluation logic 410. Because both the reference signal 416 and feedback signal 418 are equally likely to lead each other, the pre-logic 412 is designed with an arbiter type B 413 (see FIG. 5) to determine which signal arrives to the input of the pre-logic 412 first. Alternatively, any type and/or number of comparators are able to substitute for the arbiter 413. As shown in FIG. 5, the leading signal, whether that be the reference signal 416 or the feedback signal 418, is able to be steered to the slow ring 422 by the output of the arbiter 412 through the multiplexer pair 411, and the lagging signal to the fast ring 420. As a result, as described above, the lag signal will chase the lead signal and pass it after a certain amount of propagation through the ring stages. The buffers 415 are able to buffer the reference signal 416 and feedback signal 418 for subsequent outputting as they are input into the pre-logic 412. The pre-logic 412 further outputs a sign bit 423 to the evaluation logic 410 for use in calculating the polarity of the time interval between the lead and lag signals.

The control logic 414 receives input from the pre-logic 412 and has outputs coupled to the ring TDC 402, the fine and coarse counters 406, 408, and the thermometer 404. The control logic 414 is able to be used to reset the arbiters of the ring TDC 402 every other lap as will be described below in reference to FIG. 6. The control logic 414 also acts to reset and control the fine and coarse counters 406, 408, and the thermometer 404.

The fine counter 406 receives input from the ring TDC 402, the control logic 414 and the thermometer 404. As a result, the fine counter 406 is able to track the number of laps made by the lead signal around the slow ring. Further, the fine counter 406 comprises an output coupled to the evaluation logic 410 for transmitting the number of laps the lead signal has propagated when the lag signal catches up to it for use by the evaluation logic 410 in calculating the time interval between the two signals.

The coarse counter 408 receives input from the ring TDC 402, the control logic 414 and the lagging signal output by the pre-logic 412. As a result, the coarse counter 408 is able to track the number of laps that the lead signal has propagated before the lag signal arrives at the input of the ring TDC 402. Further, the coarse counter 408 comprises an output coupled to the evaluation logic 410 for transmitting the number of laps the lead signal has propagated when the lag signal arrived for use by the evaluation logic 410 in calculating the time interval between the two signals.

The thermometer 404 receives input from the ring TDC 402 and the control logic 414. As a result, the thermometer 404 is able to track the outputs of all the arbiters in the TDC ring 402 and thereby determine which arbiter the signals were at when the lag signal passed the lead signal. Further, the thermometer 404 comprises a first output coupled to the fine counter 406 for use in tracking the number of laps the lead signal has made, and a second output coupled to the evaluation logic 410 for transmitting which arbiter recorded the lag signal passing the lead signal for use by the evaluation logic 410 in calculating the time interval between the two signals.

Finally, the evaluation logic 410, as described above, receives input from the fine counter 406, the coarse counter 408, the thermometer 404 and the pre-logic 412. The evaluation logic 410 then is able to use this input to determine a time interval between the lag signal and the lead signal.

Figure 6:
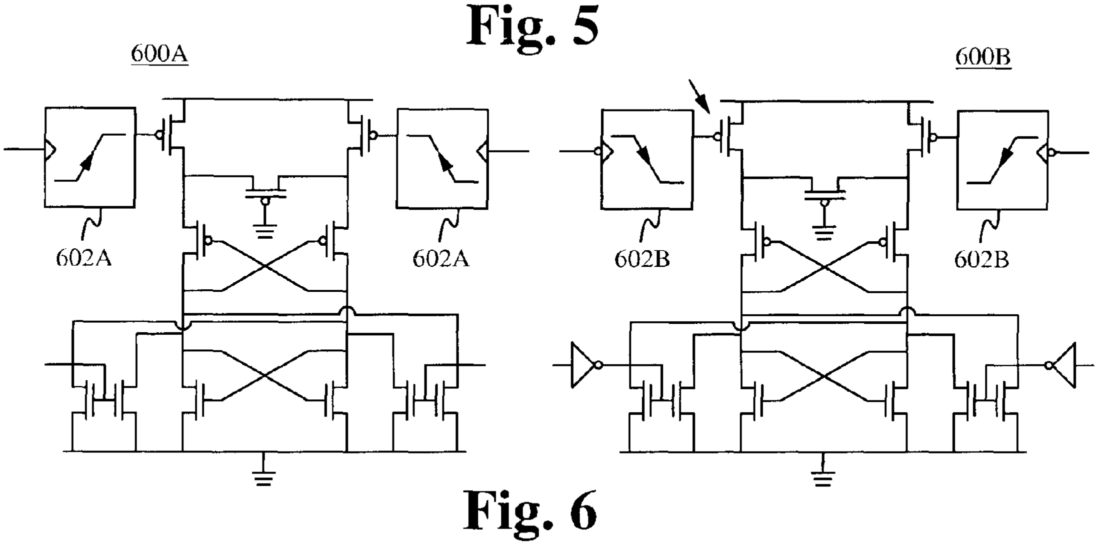
FIG. 6 is directed to a circuit diagram of a type A arbiter of a Vernier ring TDC in accordance with some embodiments of the present application.

FIG. 6 illustrates the circuits of two types of arbiters with references to FIGS. 3 and 4. It should be noted that type A and B rising and falling edge arbiters are well known in the art and therefore some of the details of their structure and operation have been omitted for clarity. As discussed above, in operation arbiter type A 600A and arbiter type B 600B are triggered by a logical rising edge and a falling edge, respectively, and reset every other lap by the output of the certain delay stage 310B in the slow ring 304 in combination with the control logic 414. The edge detector 602A, 602B in both types of arbiters outputs a narrow negative pulse to first set the arbiter and then releases the control of the arbiter to the reset signal. Because, as described above, the edge of propagating signal at the input of each arbiter will toggle between rising edge and falling edge from lap to lap, two chains of arbiters 306, 308 have been built by placing arbiter type A 600A and arbiter type B 600B alternatively along the two rings 306, 308. Among them, an outer chain of arbiters 308 operate in the odd lap of propagation, while inner chain of arbiters 306 work in the even lap. These arbiters 600A, 600B will output a logical zero unless the signal propagating in the fast ring 302 (the lag signal 314) arrives first to the inputs of the arbiter 602A, 602B. Thus, the first logical transition from zero to one ("01") at the output of the arbiter is able to be detected and used to latch the fine counter $N_F$ 406 when the lag signal 314 catches up to the lead signal 316.

Figure 7:
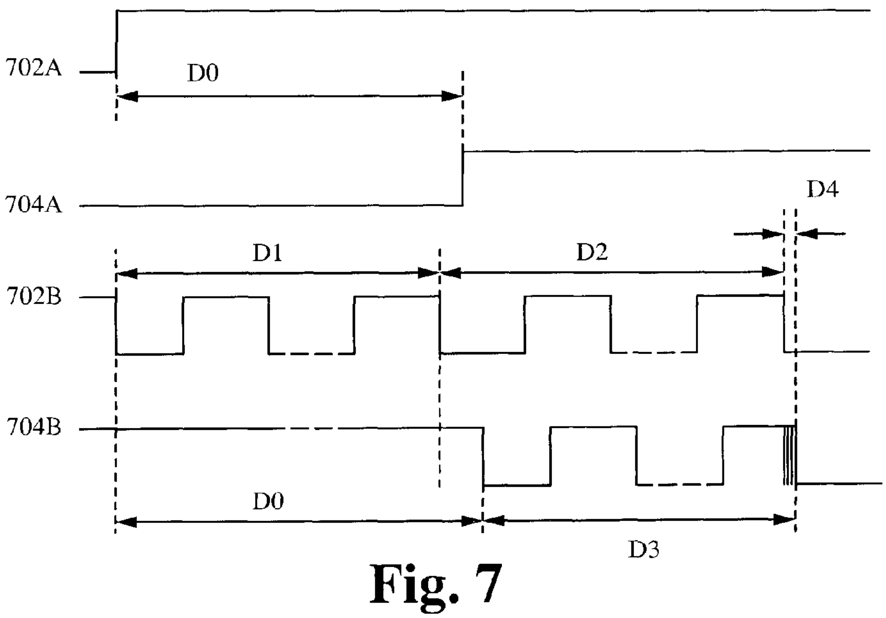
FIG. 7 is directed to a timing diagram of a Vernier ring TDC in accordance with some embodiments of the present application.

FIG. 7 illustrates an exemplary timing diagram 700 of one embodiment. Specifically, the timing diagram 700 comprises a simplified lead signal input 702A, a simplified lag signal input 704A, a standard lead signal 702B and a standard lag signal 704B. In operation, the illustrated timing diagram 700 is produced wherein the outputs of 30 arbiters are measured and combined to create a 30-bit thermometer code TH. This 30-bit thermometer code is then translated into 5-bit binary code by the thermometer decoder 404 (see FIG. 4). The fine counter $N_F$ 406 is able to track and record the number of laps that the lead signal 316 has propagated when the overpass by the lag signal 314 occurred. Coarse counter $N_C$ 408 is able to track and record the number of laps that the lead signal 316 has propagated before the lag signal 314 arrives to the inputs (initiating stages 312A, 312B) of the Vernier ring TDC 300. Therefore the total amount of delay N consists of four elements: $N_C$, $N_F$, thermometer code TH, and a sign bit. As shown in FIG. 7, the time interval between the lead signal 702A, 702B and the lag signal 704A, 704B is equal to D0=D1+(D2−D3)+D4. D1 is the time between when the lead signal 702A begins propagating through the slow ring and when the lag signal 704A arrives at the fast ring. Thus, the total delay D1 is given by $D1=30*N_C*\tau_S$. D2 is the number of "full slow ring laps of delay" delivered to the lead signal 702B after the lag signal 704B has arrived but before the lag signal 704B has passed the lead signal 702B. Thus, the total delay D2 is given by $D2=30*(N_F-N_C)*\tau_S$. D3 is the number of "full fast ring laps of delay" delivered to the lag signal 704B before the lag signal 704B has passed the lead signal 702B. Thus, the delay D3 is given by $D3=30*(N_F-N_C)*\tau_f$. Accordingly, the total amount of time gained by the lag signal 704B on the lead signal 702B due to full laps is given by D2 minus D3. D4 is the amount of time gained by the lag signal 704B on the lead signal 704B during any final incomplete lap. Thus, D4 is given by $D4=(TH-1)*\Delta\tau$, where $\Delta\tau=\tau_S-\tau_f$, (time resolution) and TH−1 represents the last gate completed before the lag signal 704B passed the lead signal 702B. Accordingly, the total time interval is equal to D0=D1+(D2−D3)+D4. Or more specifically, the TDC output is thus given by:

$$N=\pm(30(N_F-N_C)+TH+30*N_C*\tau_S/\Delta\tau)$$

The polarity of N, the sign bit 423 of the ring TDC 300, is determined by the pre-logic 412 as described above. As a result, the ring TDC of the present application is able to enjoy the benefits of high interval resolution (being able to sense very small signal delay intervals), without the need for an excessive amount of delay stages. Indeed, by using a ring, the same delay stages are theoretically able to be reused an infinite amount of times thus saving space and ultimately cost per unit.

Figure 8:
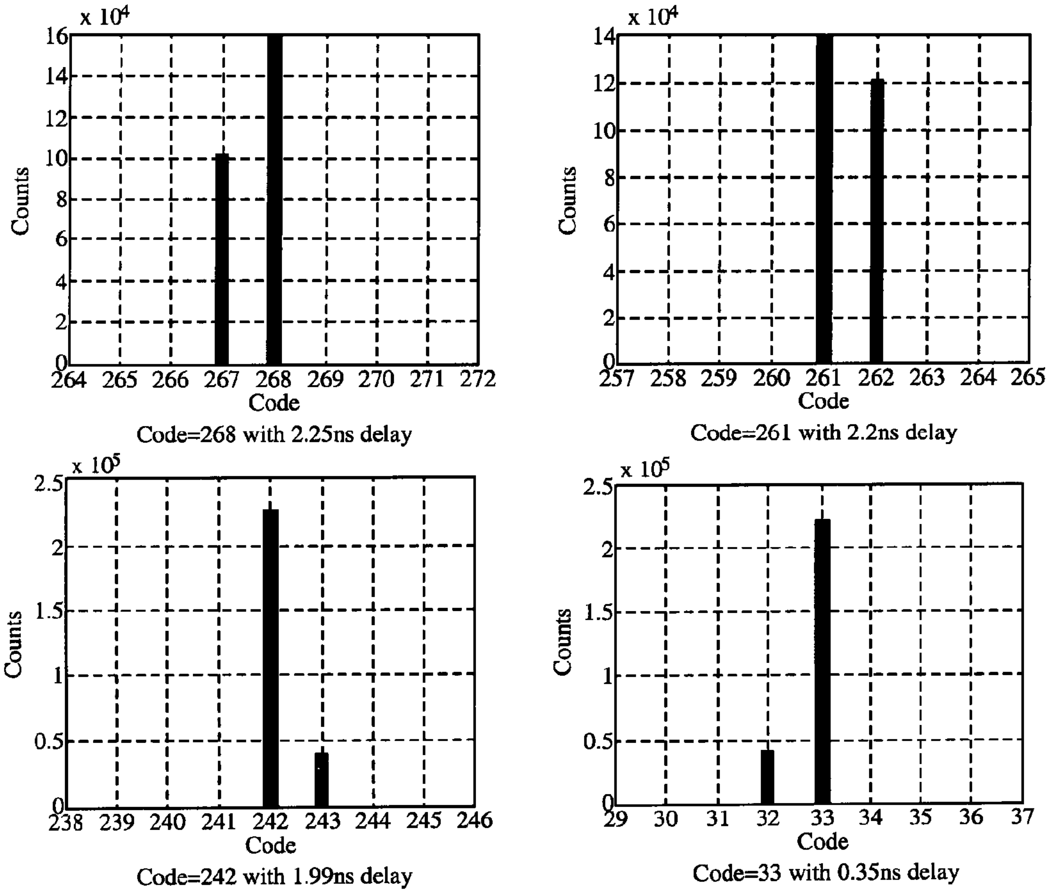
FIG. 8 is directed to a graph of the measured TDC code distribution at four constant delays in accordance with some embodiments of the present application.

To demonstrate the feasibility of the present application, the proposed Vernier ring TDC has been implemented in a 130 nm CMOS technology. The core of the TDC circuit occupies 0.75×0.35 $mm^2$. The entire TDC chip consumes 7.5 mW from a 1.5V power supply while operating at 15 MSps. The fabricated TDC chip was tested using packaged prototypes. In one of the tests, two input signals with 2 Hz frequency difference at 15 MHz were applied to generate a ramp of the time interval for measurement of transfer curve. The slope of the transfer curve indicates an average time resolution of 8 pico-seconds. However, the measured time resolution of 8 ps was limited by the available test equipment and test setup. Noise coupled from PCB/power supply and the frequency variation of the signal generators is able to affect the results of the TDC test and thus should be minimized. Simulated TDC performance achieves better than 2 ps resolution. FIG. 8 illustrates the measured code distribution with a constant time interval. It indicates that the standard deviation of the TDC output is less than 1-LSB under 256,000 tests.

Figure 9:
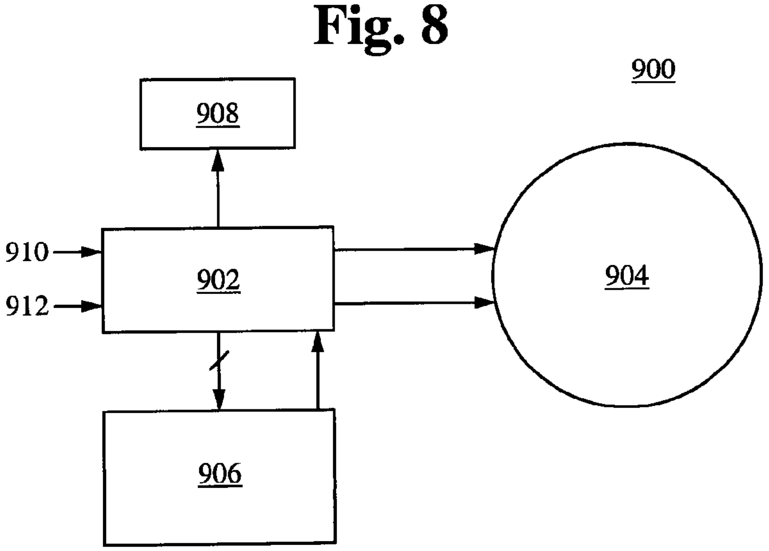
FIG. 9 is directed to a block diagram of a Vernier ring two-stage TDC in accordance with some embodiments of the present application.

FIG. 9 illustrates the block diagram of some embodiments of the present application directed to a Vernier ring based two-stage TDC 900. In operation, the two-stage TDC 900 operates as two TDCs in series wherein the first stage TDC is able to be a ring TDC with only a "coarse counter" or any other type of non-ring coarse TDC and the second stage TDC is a Vernier ring TDC of the present application. The ring based two-stage TDC 900 comprises a coarse ring TDC 902, a Vernier ring TDC 904, a "01" and "10" transition detector 906 and a counter 908. The coarse ring TDC 902 receives a lead signal 910, a lag signal 912 and a control signal from the transition detector 906, and outputs the lead and lag signals 910, 912 to the ring TDC 904. In operation, the coarse ring TDC 902 operates substantially similar to the TDC ring described above except without a fine counter and the other differences described herein. Specifically, the coarse ring TDC 902 receives the lead and lag signals 910, 912 and the transition detector 906 determines if the output of a comparator within the coarse ring TDC 902 logically transitions from a logical 0 to a logical 1 or a logical 1 to a logical 0. The detector 906 then sends a control signal back to the coarse ring TDC 904 which then causes the counter 908 to record the number of laps made by the lead signal 910 before the lag signal 912 arrived at the coarse ring TDC 902. As a result, the coarse ring TDC 902 is able to measure the integer part of time interval with a large quantization step (time resolution) $\tau_S$. Subsequently, the coarse ring TDC 902 sends the lead and lag signals 910, 912 to the coupled Vernier ring TDC 904 which operates as described above and measures the fractional part of the time interval with a tiny quantization step (time resolution) $\Delta\tau$. In some embodiments, the ring TDC 904 only uses a fine counter. Alternatively, the ring TDC 904 is able to use both a fine and coarse counter. Accordingly, by adding the integer timer interval and the fractional time interval, the total time interval between the lead and lag signals 910, 912 is able to be determined.

Figure 10:
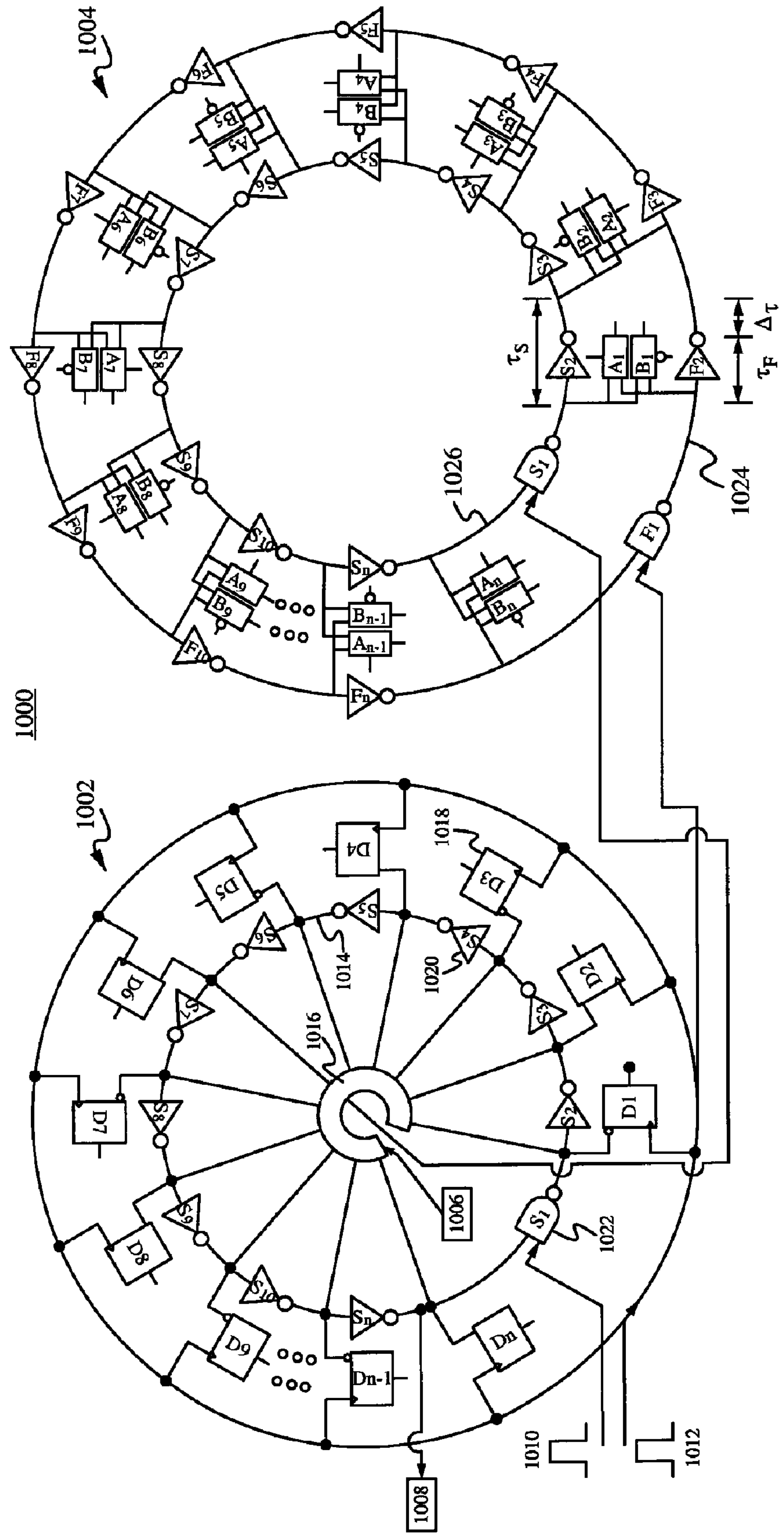
FIG. 10 is directed to a block diagram of a coarse ring TDC and two-stage TDC in accordance with some embodiments of the present application.

FIG. 10 shows the detailed architecture of two-stage TDC 1000. The left circuit is the coarse ring TDC 1002 which includes a delay ring 1014, a multiplexer 1016 and a plurality of DFFs 1018. Alternatively, any type of comparator is able to be substituted for the DFFs. The delay ring 1014 consists of an even number of delay stages 1020 and an initiating stage 1022. In some embodiments, the initiating stage 1022 is a NAND gate. In some embodiments, the delay stages 1020 are inverters. Alternatively, the initiating stage and delay stages are any logic device able to delay and/or invert the output of a signal as are well known in the art. The lead signal 1010 "start" is fed into the delay ring 1014 through the initiating stage 1022. Then the edge of the lead signal 1010 "start" propagates along the delay ring 1014. The DFFs 1018, triggered by the lag signal 1012 "stop", sample the outputs of the delay stages 1020 and the initiating stage 1022. The DFFs 1018 will output a logical "one" when the lag signal 1012 "stop" arrives to the DFF earlier than the lead signal 1010 "start". Otherwise the DFFs 1018 output a logical "zero." The outputs of all DFFs 1018 are able to be input to the transition detector 1006. Thus, the transition detector 1006 is able to determine the location of the transition of the DFFs 1018 and send a control signal corresponding to that location to the multiplexer 1016 to connect the output of the delay stage immediately preceding where the transition occurred to the input of the fast ring 1024 of the Vernier ring TDC 1004. The lead signal 1010 "start" is able to be fed into the input of the slow ring 1026 of the Vernier ring TDC 1004. The location of the transition then will be translated into a binary code. The output of the end delay stage of the ring 1014 is able to be used to trigger the lap counter 1008. The reading of the lap counter 1008 and binary code of location are combined to represent the integer part of the input time interval. Then, as described above, the fractional part of the time interval is calculated in the same manner as described in reference to FIG. 3.

Figure 11A:
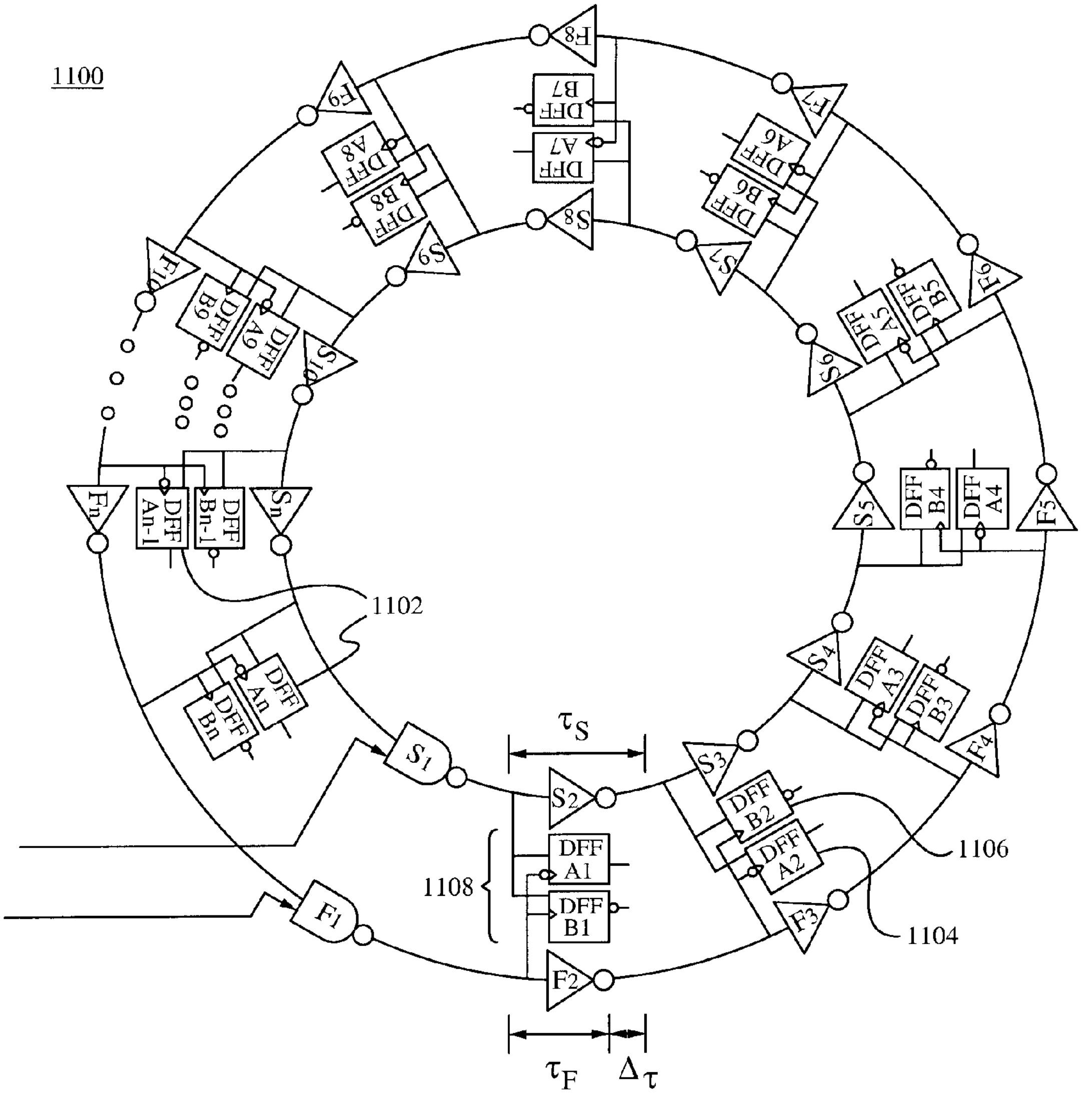
FIG. 11A is directed to a Vernier ring TDC implemented with two rings of DFFs in accordance with some embodiments of the present application.

FIG. 11A shows another exemplary block diagram of a Vernier ring TDC 1100 of some embodiments which is implemented with the two rings of DFFs 1102 instead of arbiters as shown in FIG. 3. The embodiment shown in FIG. 11, is substantially similar to that of FIG. 3 except for the differences described herein. The DFF A 1104 is triggered by the falling edge while the DFF B 1106 is triggered by the rising edge. DFF A 1104 and DFF B 1106 are placed alternatively along the two rings 1102 so that the pairs of adjacent DFFs 1108 are of different types. In some embodiments, DFF A 1104 and DFF B 1106 are combined together and replaced with a double-edge-triggered flip lop or comparator which is able to operate at either falling edge or rising edge.

Figure 11B:
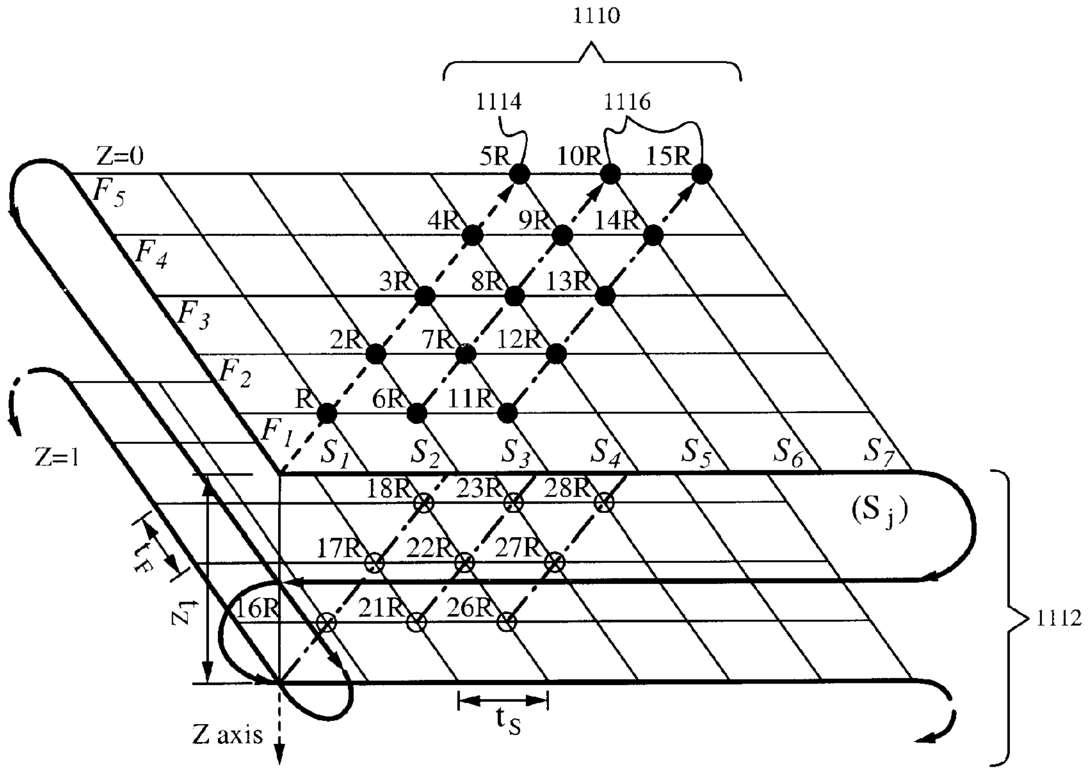
FIG. 11B is directed to a conceptual view of a 3-dimensional Vernier delay-space in accordance with some embodiments of the present application.

To explain the concept of the proposed three dimensional Vernier TDC, FIG. 11B illustrates a delay-space that comprises a slow-ring ($S_j$) with seven slow delay stages ($S_1$, $S_2$ . . . $S_7$), a fast-ring ($F_i$) with five fast delay stages ($F_1$, $F_2$ . . . $F_5$) and Z planes 1112 formed by a number of comparator matrixes 1110. The propagation delay per stage in the slow and fast rings are $t_S$ and $t_F$, respectively. Generally, this exemplary three dimensional TDC shown in FIG. 11B is able to be derived from a Venier ring TDC by adding to the number of slow-ring stages (such that the slow ring has more delay stages than the fast ring) and creating a two dimensional comparator matrix having a number of comparators with the now uneven fast and slow rings. As shown in FIG. 11B, a 5-stage Vernier ring TDC is able to have its number of slow ring delay stages ($S_1$, $S_2$, . . . ) increased from five to seven while two comparator lines 1116 are added to the right-side of an existing comparator line 1114 to form a two dimensional comparator matrix 1110 having a number of comparators (R, 2 R, . . . 15 R). As a result of this two dimensional arrangement of the slow and fast rings (permitting two more rows of comparators), the comparator array's detectable range is able to be extended from the 5 R provided by a conventional Vernier TDC to 15 R, where $R=t_S-t_F$ is TDC time resolution. In operation, two signals start from the origin on the plane Z=0 along the fast and slow rings. As the signals progress, the two dimensional comparator matrix 1110 compares the rising and/or falling edges of two signals in fast and slow rings every lap. If the lagging signal propagating along the fast ring is not able to catch the leading signal propagating along the slow ring after one lap, the input time interval must be larger than 15 R, and the race goes into the second lap with re-use of the fast and slow delay rings and the comparators (R−15 R). In this scenario, the race in the second lap is able to be represented in the delay space using another plane denoted Z=1, where the detectable range goes from 16 R to 30 R. The re-use of the fast and slow rings and the comparators will continue until the lagging signal catches the leading signal. As a result, the delay space is able to theoretically contain any number of planes. Similar to the Vernier ring TDC described above, a large time interval is able to be first interpolated with a coarse resolution (the period of slow ring propagation by the leading signal prior to the arrival of the lagging signal at TDC input). After the lagging signal arrives, the remainder of the time interval between the signals is then able to be quantized with a fine resolution (the delay difference between fast and slow stages). Thus, the maximum detectable range of the TDC is able to be infinitely large without sacrificing the level of fine resolution. Overall, this delay difference or time interval detected by a comparator located at (i,j,z) in delay-space is given by $$D(i,j,z)=J*t_S-i*t_F+z*(7t_S-5t_F)=i*R(j-i)*t_S+z*t_Z,$$

where i, j, z are the coordinates in the three dimensional delay-space, R is the minimum detectable time interval and $t_Z=7t_S-5t_F=15$ R is the maximum detectable time interval on the same Z-plane. The delay difference in all z-planes becomes a monotonic function without overlap when $2t_S-t_F=6$ R and $7t_S-5t_F=15$ R.

Without increasing the delay stages and comparators, this TDC is able to measure an infinitely large time interval as long as a counter has sufficient number of bits to hold the data. Thus, unlike a conventional Vernier TDC that requires large testing time to measure large time interval, the measurement time for the proposed three dimensional Vernier TDC has been reduced. For instance, as described above, the time taken to measure the time interval of 15 R requires only propagating 7 delay stages instead of 15 stages needed by a conventional Vernier TDC.

Figure 12A:
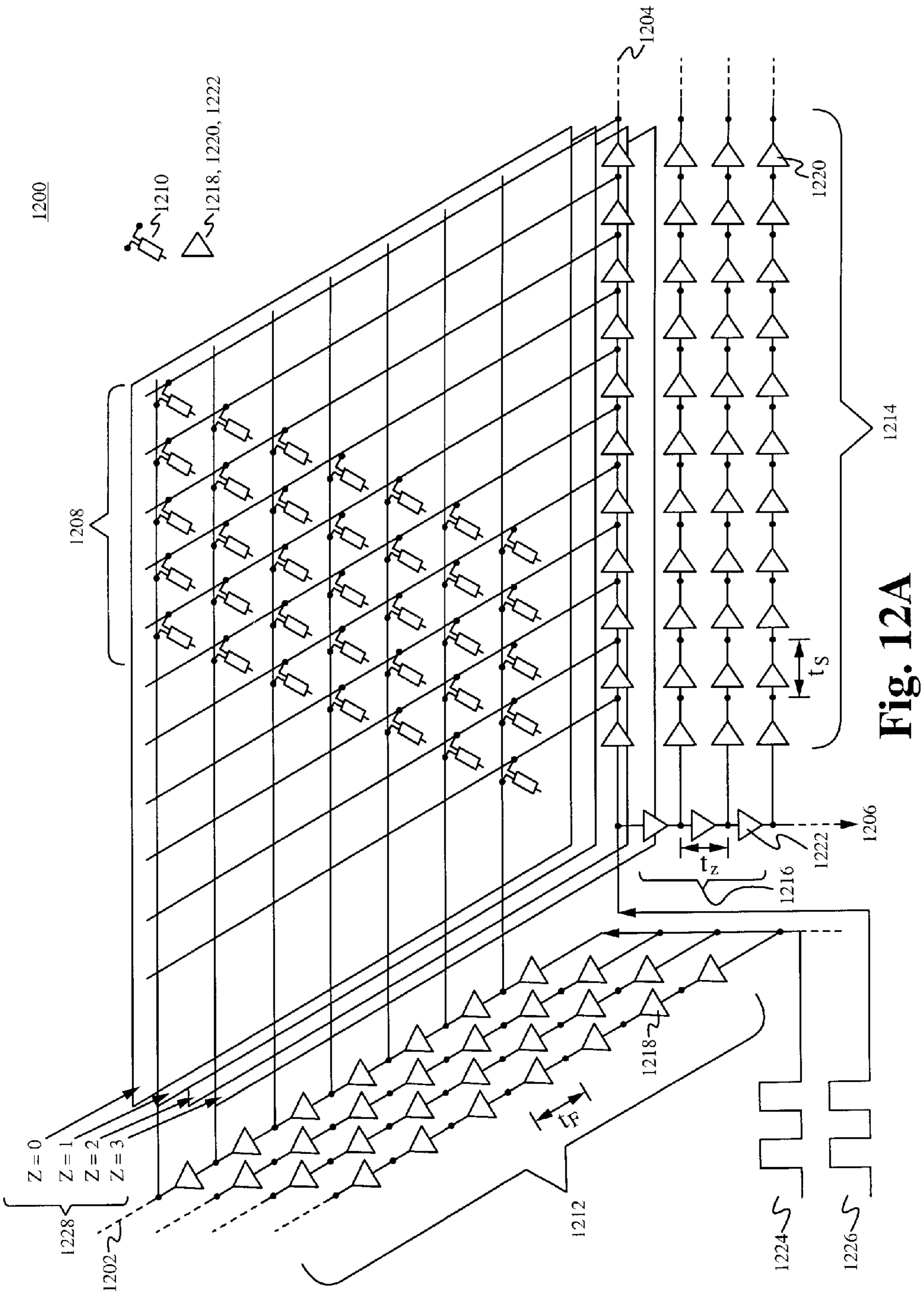
FIG. 12A is directed to a block diagram of a three dimensional Vernier TDC with comparator matrixes in accordance with some embodiments of the present application.
Figure 12B:
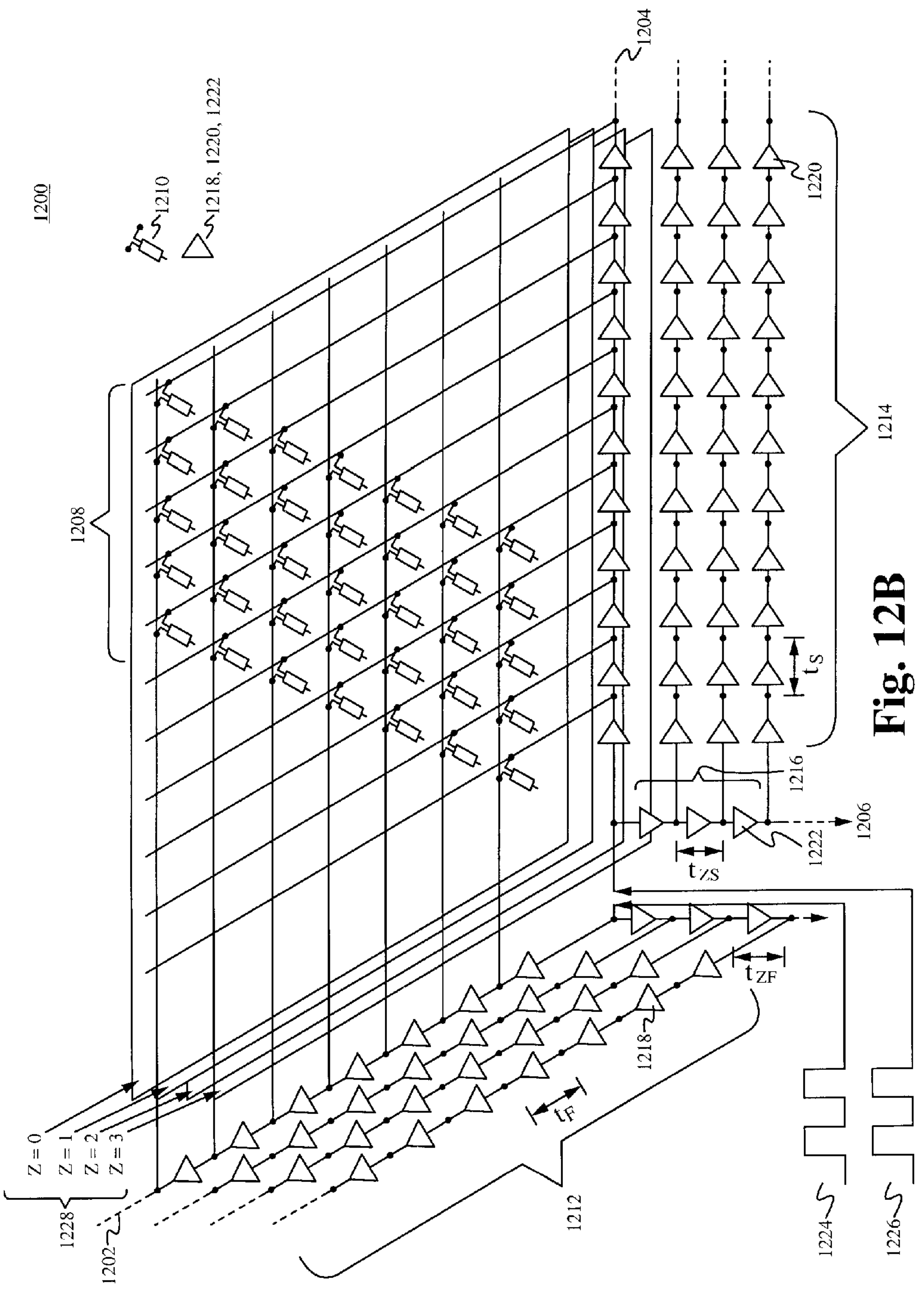
FIG. 12B is directed to an alternate block diagram of a three dimensional Vernier TDC with comparator matrixes in accordance with some embodiments of the present application.

In FIG. 12A, a block diagram of a three dimensional (3D) Vernier TDC with comparator matrix 1200 is illustrated. The TDC with comparator matrixes 1200 comprises a lag signal 1224, a lead signal 1226, a fast axis 1202, a slow axis 1204, a Z axis 1206 and a number of Z planes 1228 each comprising a comparator matrix 1208 having one or more comparators 1210. The fast axis 1202 comprises one or more fast delay chains 1212 comprising a number of serially coupled fast delay stages 1218 with an adjustable delay interval of $t_F$. The slow axis 1204 comprises one or more slow delay chains 1214 comprising a number of serially coupled slow delay stages 1220 with an adjustable delay interval of $t_S$. The Z axis 1206 comprises a single Z delay chain 1216 comprising a number of serially coupled Z delay stages 1222 with an adjustable delay interval of $t_Z$. In some embodiments, the Z axis 1206 comprises a pair of Z delay chains 1216 as shown in FIG. 12B.

Alternatively, the Z axis 1206 comprises any number of Z delay chains 1216. The number of slow and fast delay chains 1212, 1214 is determined by the number of Z delay stages 1222 within the Z axis delay chains 1216. Specifically, if there are n Z delay stages 1222, there will be n+1 fast axis and slow axis chains 1212, 1214.

The lead signal 1226 is coupled to the input of an initial Z delay stage 1222 and the input of the initial slow delay stage 1220 of the first slow delay chain 1214 for propagating the lead signal down the chains. In some embodiments, the initiating stage or stages are combined with a delay stage or stages such that the initiating stage is able to both initiate and delay leading and lagging signals. The lag signal 1224 is coupled to the inputs of the initial fast delay stages 1218 for propagating the lag signal down each of the chains. Alternatively, similar to the lead signal 1226, the lag signal 1224 is only coupled to the input of a second initial Z delay stage (not shown) and the input of the initial fast delay stage 1218 of the first fast delay chain 1212. In this alternate embodiment, as described above, the Z axis comprises two Z delay chains, wherein the second delay chain is coupled to the set of fast delay chains 1212 in the same manner as the first Z delay chain 1216. Each of the comparators 1210 are coupled to an output of one of the fast delay stages 1218 and one of the slow delay stages 1220 such that each comparator is able to determine if the lag signal 1224 was received before the lead signal 1226. As a result, as shown in FIG. 12, the comparators 1210 in cooperation with the delay chains 1212, 1214 form comparator matrixes 1208 in each Z plane 1228.

As an example embodiment, as shown in FIG. 12A, each comparator matrix 1208 has 35 comparators 1210. Alternatively, any number of comparators 1210 is able to be used. The comparators 1210 are able to comprise any combination of an arbiter, flip flop or latch, either single-ended or differential. Alternatively, the comparators 1210 comprise any circuit device that is able to compare, sample and/or latch two input signals and output a signal based on said comparison, sampling and/or latching. In the illustrated exemplary embodiment, the 35 comparators 1210 in the Z plane 1228 are placed into a comparator matrix 1208 with 5 columns and 7 rows. The first seven comparators 1210 along the first diagonal starting from the bottom left of the matrix 1208 are arranged as in the conventional Vernier delay line TDC as discussed above. Therefore, as discussed above, the delay difference (D) between two propagating signals for each comparator is set to:

$$D(n)=n*(t_S-t_F)=n*\Delta t(1\leqq n\leqq 7)$$

Where Δt is the time resolution of the presented TDC and n is the number of comparators. The next seven comparators (8-14) are shifted to the right by one slow delay stage 1220 from the position of comparators 1-7, hence D(n) is set to:

$$D(n)=(n-7)*(t_S-t_F)+t_S(8\leqq n\leqq 14)$$

If $t_S$ is set to $7*(t_S-t_F)=7*\Delta t$, such that the delay time $t_S$ of each slow delay stage 1220 then equals the amount of time the lag signal 1224 has been able to gain on the lead signal 1226 through the first seven comparators 1210, then the equation becomes:

$$D(n)=n*\Delta t(1\leqq n\leqq 14)$$

The remainder of the comparators 1210 are arranged in the same manner, in this exemplary case, creating three more columns with comparators 15-35. Thus, in the same manner as above D(n) for all the comparators 1210 on the same Z plane is proportional to n as given by $$D(n)=n*\Delta t(1\leqq n\leqq 35)$$

Further for any one comparator "n" on a Z plane number "Zn", D(n) is determined by $$D(n)=n*\Delta t+Zn*t_Z(1\leqq n\leqq 35)$$

Where $t_Z$ is the delay per stage in Z axis as described above. In some embodiments comprising a pair of delay chains in the Z axis, tz is equal to the difference in delay per stage between the pair of delay chains, namely $t_{ZS}-t_{ZF}$. If $t_Z$ is set equal to the time the lag signal 1224 should have caught up to the lead signal 1226 after traversing an entire Z plane 1228 as shown below $$t_Z=35*(t_S-t_F)=35*\Delta t;$$

then the D(n) equation becomes:

$$D(n,Zn)=(n+35*Zn)\Delta t(1\leqq n\leqq 35,Zn\leqq 0)$$

As a result, it is clear that D(n) is monotonously increasing continuous function of n and Zn in all Z planes 1228. Thus, similar to as described above, the outputs of all the comparators 1210 are able to be combined to create a thermometer code wherein there is neither gap nor overlap in this created TDC output code over the whole detectable range.

In operation, each of the comparators 1210 operate such that as the lead and lag signal propagate down the fast and slow chains 1212, 1214, the output of any one comparator will toggle from a logical "zero" to "one" or from "one" to "zero" only after detecting that the lag signal 1224 has passed the lead signal 1226. Again, the outputs of these comparators 1210 in each Z plane 1228 are combined to create a thermometer code according to the sequence of comparators 1210 described above (comparators 1-35). Specifically, starting at the bottom left of the matrix 1208, the comparator sequence moves up the leftmost column (from bottom to top as shown in FIG. 12), then up the second leftmost column and so on, restarting at the leftmost column at each new comparator matrix 1208 in each new Z plane 1228. The location of the "zero-to-one" or "one-to-zero" transition in the thermometer code will be detected and translated into a binary code TH. The number of the Z plane 1228 where the transition occurred is recorded as Zn. The TDC output is thus given by:

$$N=D(TH,Zn)/\Delta t=TH+35*Zn$$

More generally, assuming each Z plane 1228 has a comparator matrix 1208 with J rows and K columns, the inputs of the comparator in the $j^{th}$ row and $k^{th}$ column, denoted as $C_{jk}$ are connected to the output of the fast delay stage $F_j$, and the output of the slow delay stage $S_{j+k-1}$ ($1\leqq j\leqq J$, $1\leqq k\leqq K$). If the "zero-to-one" or "one-to-zero" transition of the thermometer code is detected in the comparator $C_{jk}$, then the TDC output is given by $$TH=j+(k-1)*J$$

$$N=D(TH,Zn)/\Delta t=TH+J*K*Zn$$

As a result, the TDC with comparator matrixes is able to have high resolution (small Δt) without sacrificing high end range. In other words, because of the TDC's "stacked matrix" configuration, it is able to reuse delay stages for each column in the comparator matrix (e.g., comparators 1, 8, 15, 22, and 29 all being connected to the output of the first fast delay stage). Further, due to the stacked configuration, the comparator matrixes 1208 are able to occupy as little space as possible thereby lowering overall costs. Thus, even with a high resolution, the TDCs with comparator matrixes are able to maintain a large detectable range due to their compact stacked matrix structure.

Figure 13A:
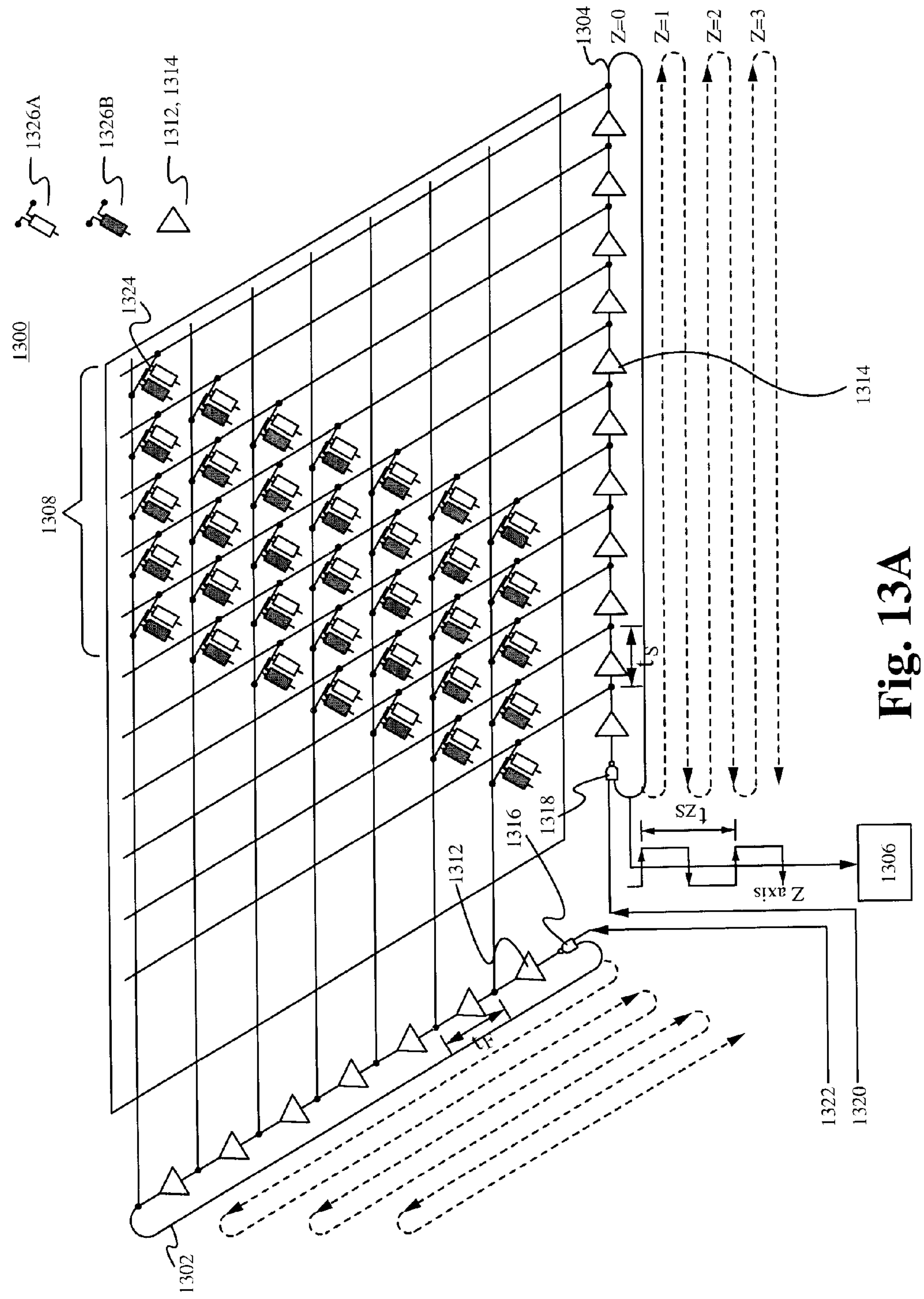
FIG. 13A is directed to a block diagram of a three dimensional Vernier ring TDC with comparator matrix in accordance with some embodiments of the present application.

FIG. 13A shows the block diagram of the Vernier ring TDC with a comparator matrix 1300 of some embodiments of the present application. The Vernier ring TDC with a comparator matrix 1300 shown in FIG. 13, is substantially similar to the TDC with comparator matrixes 1200 described above except for the differences described herein. Specifically, instead of including stacks of matrixes, the Verner ring TDC with a comparator matrix 1300 uses a Vernier ring as described above in a matrix formation that simulates virtual stacks of matrixes in a virtual Z axis. The ring TDC with a comparator matrix 1300 comprises a fast ring 1302, a slow ring 1304, a virtual Z axis based on lap counter 1306 and a Z plane 1310 comprising a comparator pair matrix 1308. The fast ring 1302 comprises a plurality of fast delay stages 1312 with an adjustable delay of $t_F$ and at least one initiating stage 1316. In some embodiments, the fast delay stages 1312 are inverters and the initiating stage 1316 is a NAND gate. Alternatively, the fast delay stages 1312 and initiating stage 1316 are able to comprise any type of logic gate that is able to delay and/or toggle an input signal as are well known in the art. The slow ring 1304 comprises a plurality of slow delay stages 1314 with an adjustable delay of $t_S$ and an initiating stage 1318. In some embodiments, the slow delay stages 1314 are inverters and the initiating stage 1318 is a NAND gate. Alternatively, the slow delay stages 1314 and initiating stage 1318 are able to comprise any type of logic gate that is able to delay and/or toggle an input signal as are well known in the art. In some embodiments, the initiating stages are able to be a combination of an initiating stage and a delay stage such that the initiating stages are able to both initiate and delay leading and lagging signals. It should be noted however that in such embodiments, the difference in delay between the initiating stages would be equal to the difference in delay between a delay stage from the slow ring and a delay stage from the fast ring. A lead signal 1320 is able to be fed into the slow ring 1304 through the initiating stage 1318. A lag signal 1322 is able to be fed into the fast ring 1302 through the initiating stage 1316. The lag signal 1322 will chase the lead signal 1320 with respect to position in the rings as the lead signal 1320 travels through the slow ring 1304 and the lag signal 1322 travels through the fast ring 1302. Eventually, due to a greater delay interval in the slow delay stages 1314 than in the fast delay stages 1312, the lag signal 1322 will pass the lead signal 1320 after a certain amount of propagation.

The virtual Z axis created by the lap counter 1306 has two different scales due to two step interpolations as shown in FIG. 7. The fast ring 1302 has a period of $t_{ZF}$ and the slow ring has a period of $t_{ZS}$. The virtual Z axis scales in $t_{ZS}$ during the period before the lag signal 1322 is fed into the fast ring 1302. After which, the virtual Z axis scales in $t_{ZS}-t_{ZF}$, which is equal to the two time of maximum detectable range in the comparator matrix (e.g., $2*5*7*(t_S-t_F)$) with a comparator pair matrix 1308 of five columns and seven rows as shown in FIG. 13) when both the lag signal 1322 and the lead signal 1320 are propagating in each ring 1302, 1304. The virtual Z plane has 35 comparator pairs 1324 in a comparator matrix 1308, wherein the comparator pairs 1324 are able to determine if the lag signal 1322 has caught up with the lead signal 1320. Alternatively, any number of comparator pairs 1324 are able to comprise the comparator pair matrix 1308 wherein the number is only dependent on the number of slow and fast delay stages 1314, 1312 in the slow and fast delay rings 1302, 1304. In some embodiments, the comparator pairs 1324 comprise an arbiter, a flip flop or a latch, either single-ended or differential. Alternatively, the comparator pairs 1324 comprise any circuit device that is able to compare, sample or latch one of the two input signals with or triggered by the other signal.

In operation, because the edge of a propagating signal at the input of each comparator in a comparator pair 1324 will toggle between rising-edge and falling-edge from lap to lap, two types of comparators are employed in an "even lap" and an "odd lap" of the propagation, respectively. The odd lap comparators 1326A operating in odd laps are rising edge effective while the even lap comparators 1326B operating in even laps are falling edge effective. As shown in FIG. 13, each comparator pair 1324 comprises one odd lap comparator 1326A and one even lap comparator 1326B. As shown in the exemplary embodiment in FIG. 13 and described above, the comparator matrix 1308 comprises thirty five comparator pairs 1324 in the virtual Z plane, wherein each pair 1324 is placed in the matrix 1308 in order to form five columns and seven rows. Furthermore, each pair 1324 is coupled to the output of one of the slow delay stages 1314 and one of the fast delay stages 1312. In this manner, similar to the TDC with comparator matrixes 1200 above, each comparator pair 1324 sequentially determines if the lag signal 1322 arrives before the lead signal 1320. Specifically, the output of one of the comparators 1326A, 1326B toggles from a logical "zero" to "one" or from "one" to "zero" only after detecting that the lag signal 1322 has passed the lead signal 1320. However, unlike the TDC with comparator matrixes 1200, only one of the comparators 1326A, 1326B operates on a given lap. During odd laps the odd lap comparators 1326A operate, and during the even laps the even lap comparators 1326B operate. Thus, the order in which the comparators 1326A, 1326B operate progresses with the odd lap comparators 1326A from the bottom left of the comparator pair matrix 1308 to the top of each column moving sequentially to the right, and then back through the comparator pair matrix 1308 in the same manner during the next lap only this time with the even lap comparators 1324B. The outputs of these comparators 1326A, 1326B in the virtual Z plane 1310 are combined and output to a thermometer (not shown) according to a thermometer code. The location of the "zero-to-one" or "one-to-zero" transition in the thermometer code is then able to be detected by the thermometer and translated into a binary code TH.

The counter 1306 is coupled to the slow ring 1304 and comprises two types of lap counters: a fine counter $N_F$ and a coarse counter $N_C$ (not shown). The fine counter $N_F$ is able to record the number of laps that the lead signal 1320 has propagated through the slow ring 1304 when it was passed by the lag signal 1322. The coarse counter $N_C$ is able to record the number of laps that the lead signal 1320 has propagated through the slow ring 1304 before the lag signal 1322 arrives to the initiating stage 1316. Therefore the total amount of delay N consists of three elements: $N_C$, $N_F$, thermometer code TH. The ring TDC with a comparator matrix output is thus given by $$N=70*(N_F-N_C)+TH+22*N_C*t_S/\Delta t$$

Figure 13B:
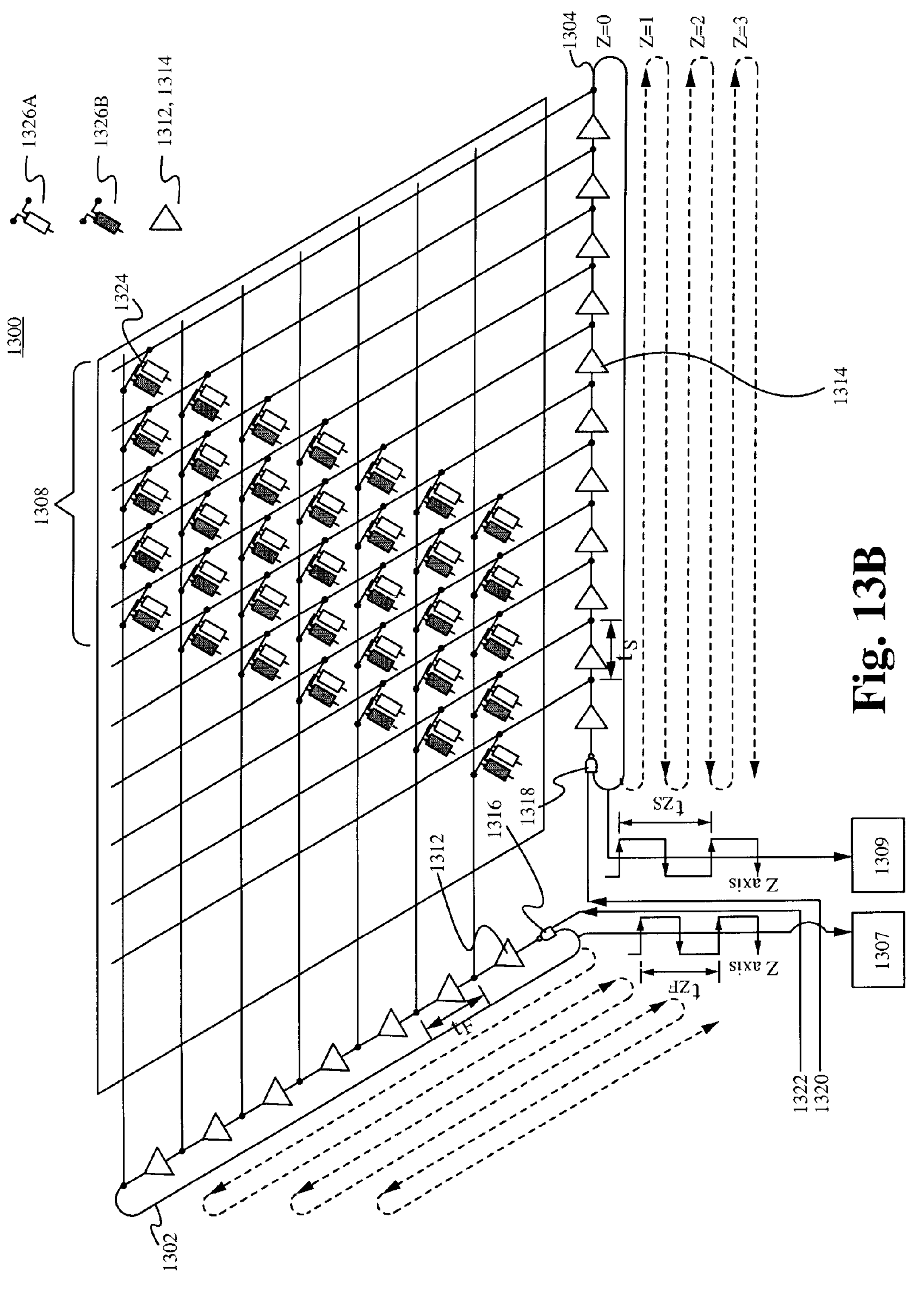
FIG. 13B is directed to an alternate block diagram of a three dimensional Vernier ring TDC with comparator matrix in accordance with some embodiments of the present application.

In some embodiments as shown in FIG. 13B, a fine counter 1307 $N_F$ is coupled to the fast ring 1302 and the course counter 1309 $N_C$ is coupled to the slow ring 1304. As a result, the fine counter 1307 $N_F$ is able to record the number of laps that the lag signal 1322 has propagated through the fast ring 1302 and the coarse counter 1309 $N_C$ is able to record the number of laps that the lead signal 1320 has propagated through the slow ring 1304. Accordingly, $N_C-N_F$ is the number of laps that the lead signal 1320 has propagated through the slow ring 1304 before the lag signal 1322 arrives to the initiating stage 1316. Therefore, in these embodiments the total amount of delay N is given by $$N=70*N_F+TH+22(N_C-N_F)*t_S/\Delta t$$

Thus, the ring TDC with a comparator matrix 1300 is able to utilize a fine resolution without the need for an excessive amount of delay stages. Specifically, the ring TDC with a comparator matrix 1300 is able to not only reuse each delay stage with each lap of the signals, it also reduces the number of delay stages needed by using a matrix format that allows the same delay stage output to be coupled to multiple comparators. Accordingly, the ring TDC with a comparator matrix described herein is able to have a fine resolution as well as a large detectable range. It should be noted that all the pre-logic, control logic, evaluation logic, thermometer and other items described in FIG. 4 in relation to FIG. 3 are able to operate in the same manner in relation to the present embodiment of FIG. 13. Thus, the embodiment shown in FIG. 13 is similarly able to calculate the time interval or total delay N between the lead signal 1320 and the lag signal 1322.

Figure 14:
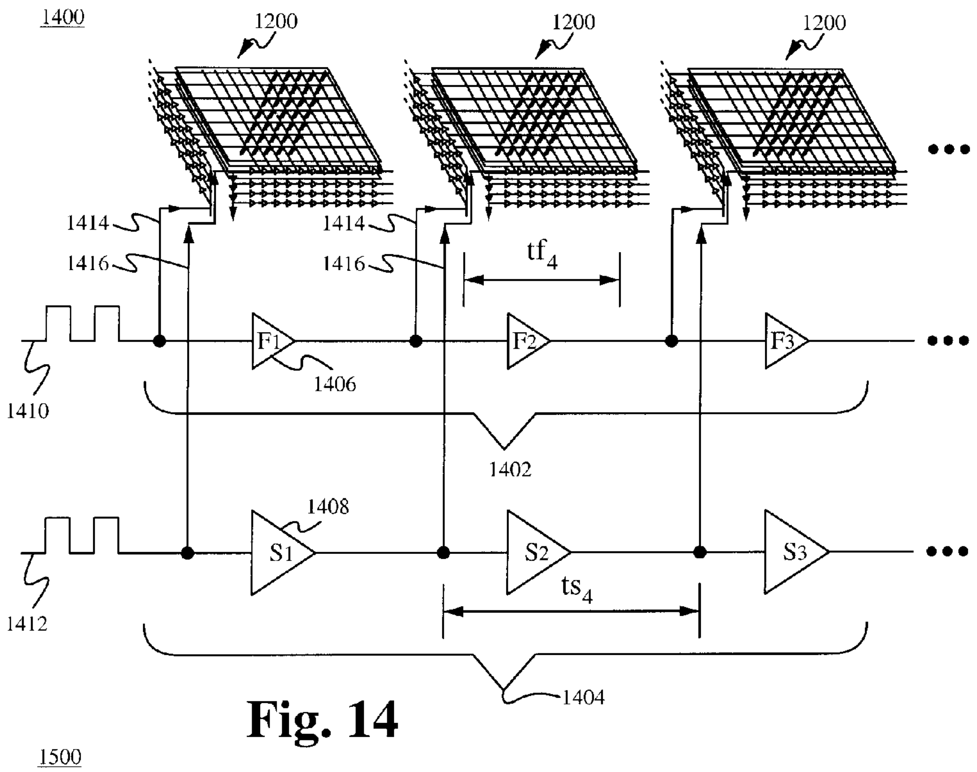
FIG. 14 is directed to a block diagram of four dimensional Vernier TDC with comparator matrixes in accordance with some embodiments of the present application.

FIG. 14 depicts a block diagram of a four dimensional matrix Vernier TDC 1400 of some embodiments of the present application. The embodiment described in FIG. 14 is substantially similar to the embodiment described in FIG. 12 except for the differences described herein. The four dimensional TDC with comparator matrixes 1400 comprises a 4th delay dimension of the TDC and a plurality of three dimensional matrix Vernier TDCs 1200 as described in FIG. 12. The 4th delay dimension comprises a fast delay line 1402 and a slow delay line 1404. The fast delay line 1402 is configured to receive a lag signal 1410 and comprises one or more fast delay stages 1406 with an adjustable delay interval of $t_{F4}$. The slow delay line 1404 is configured to receive a lead signal 1412 and comprises one or more slow delay stages 1408 with an adjustable delay interval of $t_{S4}$. The three dimensional TDCs with comparator matrixes 1200 each have an adjustable delay interval of $t_{3d}$ and comprise a lead signal input 1416 and a lag signal input 1414. Further, the lead signal inputs 1416 are coupled to the slow delay line 1404 before and after the slow delay stages 1408 and the lag signal inputs 1414 are coupled to the fast delay line 1402 before and after the fast delay stages 1406. Thus, the minimum scale in the 4th dimension is equal to $t_{S4}-t_{F4}$, which is also set to equal the detectable range of the three dimensional matrix Vernier TDC 1200 to eliminate the overlap and gap in the TDC output code. Thus, the values $t_{S4}$ and $t_{F4}$ are set such that $t_{S4}-t_{F4}=t_{3d}$. Accordingly, the $4^{th}$ dimension of delay provided by the next layer of delay lines 1402 and 1404 provides another layer of abstraction to the TDC with comparator matrixes that is able to produce an even larger detectable range without sacrificing resolution.

Figure 15:
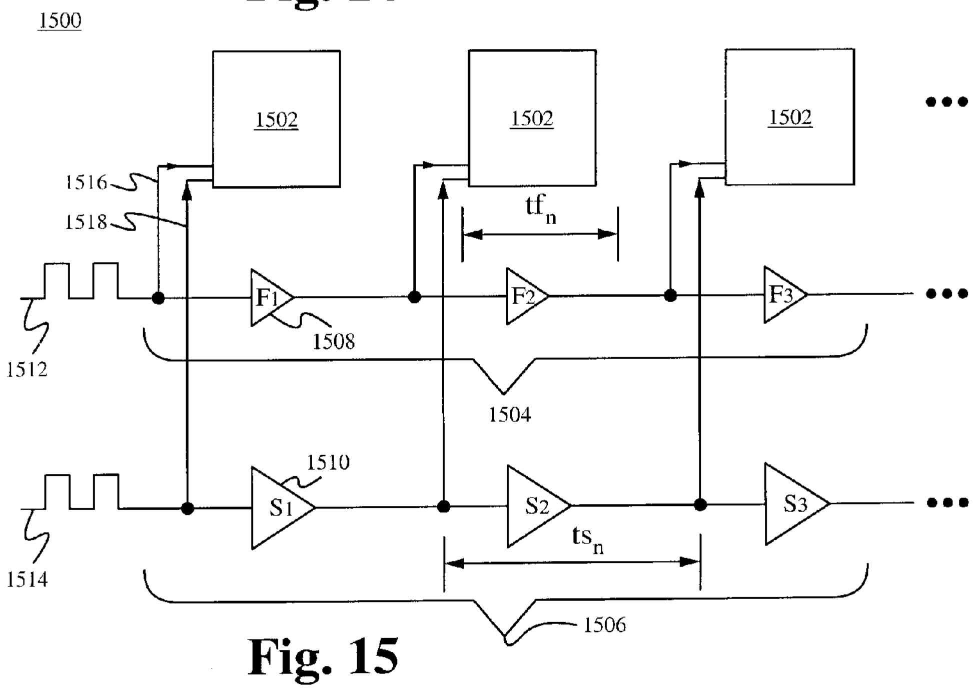
FIG. 15 is directed to a block diagram of an n-dimensional Vernier TDC with comparator matrixes in accordance with some embodiments of the present application.

FIG. 15 depicts a block diagram of an n-dimensional matrix Vernier TDC 1500 of some embodiments. The embodiments described in FIG. 15 are substantially similar to the embodiments described in FIG. 14 except for the differences described herein. The n-dimensional TDC with comparator matrixes 1500 comprises an nth delay dimension of the TDC and a number of (n−1) dimensional matrix Vernier TDCs 1502. The nth delay dimension comprises a fast delay line 1504 and a slow delay line 1506. The fast delay line 1504 is configured to receive a lag signal 1512 and comprises one or more fast delay stages 1508 with an adjustable delay interval of $t_{Fn}$. The slow delay line 1506 is configured to receive a lead signal 1514 and comprises one or more slow delay stages 1510 with an adjustable delay interval of $t_{Sn}$. The (n−1) dimensional TDCs with comparator matrixes 1502 each have an adjustable delay interval of $t_{nd}$ and comprise a lead signal input 1518 and a lag signal input 1516. Further, the lead signal inputs 1518 are coupled to the slow delay line 1506 before and after the slow delay stages 1510 and the lag signal inputs 1516 are coupled to the fast delay line 1504 before and after the fast delay stages 1508. Thus, the minimum scale in the nth dimension is equal to $t_{Sn}-t_{Fn}$, which is also set to equal the detectable range of the (n−1) dimensional matrix Vernier TDCs 1502 to eliminate the overlap and gap in the TDC output code. Thus, $t_{Sn}$ and $t_{Fn}$ are set such that $t_{Sn}-t_{Fn}=t_{nd}$. Accordingly, the $n^{th}$ dimension of delay provided by the next layer of delay lines 1504 and 1506 is able to provide a theoretically infinite number of layers of abstraction to the TDC with comparator matrixes such that it is able to produce a theoretically infinite detectable range without sacrificing resolution.

Figure 16:
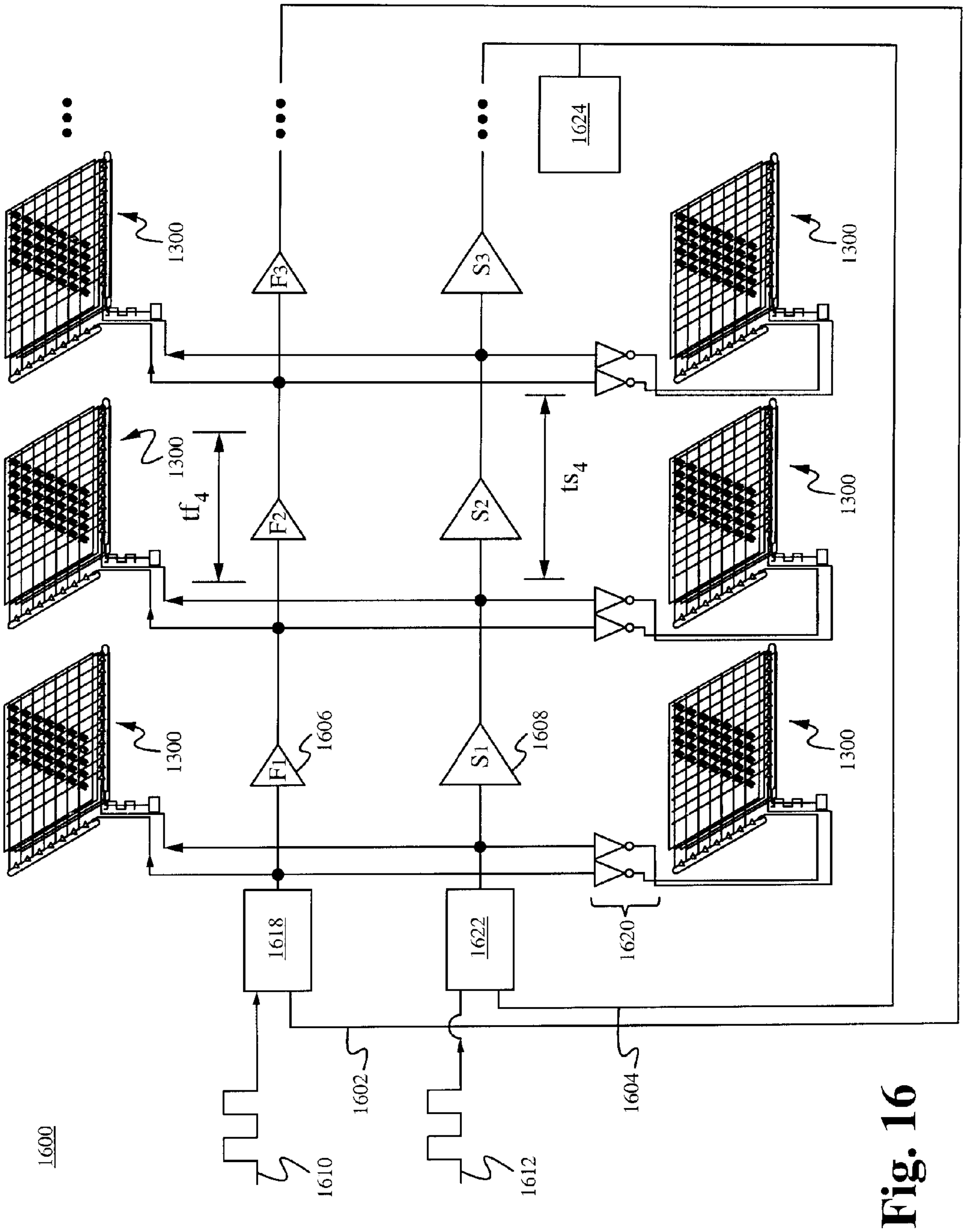
FIG. 16 is directed to a block diagram of a four dimensional Vernier ring TDC with comparator matrixes in accordance with some embodiments of the present application.

FIG. 16 depicts a block diagram of a four dimensional Vernier ring TDC with a comparator matrix 1600 of some embodiments. The embodiments described in FIG. 16 are substantially similar to the embodiments described in FIG. 13 except for the differences described herein. The four dimensional ring TDC with a comparator matrix 1600 comprises a 4th delay dimension and a number of three dimensional Vernier ring TDCs with a comparator matrix 1300. The three dimensional ring TDCs with a comparator matrix operate in a substantially similar manner as those described with reference to FIG. 13. The 4th delay dimension comprises a fast delay ring 1602 and a slow delay ring 1604. The fast delay ring 1602 is configured to receive a lag signal 1610 and comprises a fast initiating stage 1618 and one or more fast delay stages 1606 with an adjustable delay interval of $t_{F4}$. The slow delay ring 1604 is configured to receive a lead signal 1612 and comprises a slow initiating stage 1622, a counter 1624 and one or more slow delay stages 1608 with an adjustable delay interval of $t_{S4}$. The fast and slow rings 1602, 1604 and their components (e.g., counter 1624) operate in the same manner as the fast and slow rings 1302, 1304 described in reference to FIG. 13. The three dimensional ring TDCs with a comparator matrix 1300 each have an adjustable delay interval of $t_{3d}$ and comprise a lead signal input 1616 and a lag signal input 1614. In some embodiments, a number of the ring TDCs with a comparator matrix 1300 further comprise a pair of inverters 1620 for inverting the lead and lag signal 1610, 1612 as they are input into the TDCs 1300. Further, the lead signal inputs 1616 are coupled to the slow delay ring 1604 before and after the slow delay stages 1608 and the lag signal inputs 1614 are coupled to the fast delay ring 1602 before and after the fast delay stages 1606. Thus, the minimum scale in the 4th dimension is equal to $t_{S4}-t_{F4}$, which is also set to equal the detectable range of the three dimensional ring matrix Vernier TDC 1300 to eliminate the overlap and gap in the TDC output code. Thus, $t_{S4}$ and $t_{F4}$ are set such that $t_{S4}-t_{F4}=t_{3d}$. Accordingly, the $4^{th}$ dimension of delay provided by the next layer of delay rings 1602 and 1604 provides another layer of abstraction to the ring TDC with a comparator matrix that retains all the benefits of the three dimensional ring TDC with a comparator matrix, but is able to produce an even larger detectable range without sacrificing resolution.

Figure 17:
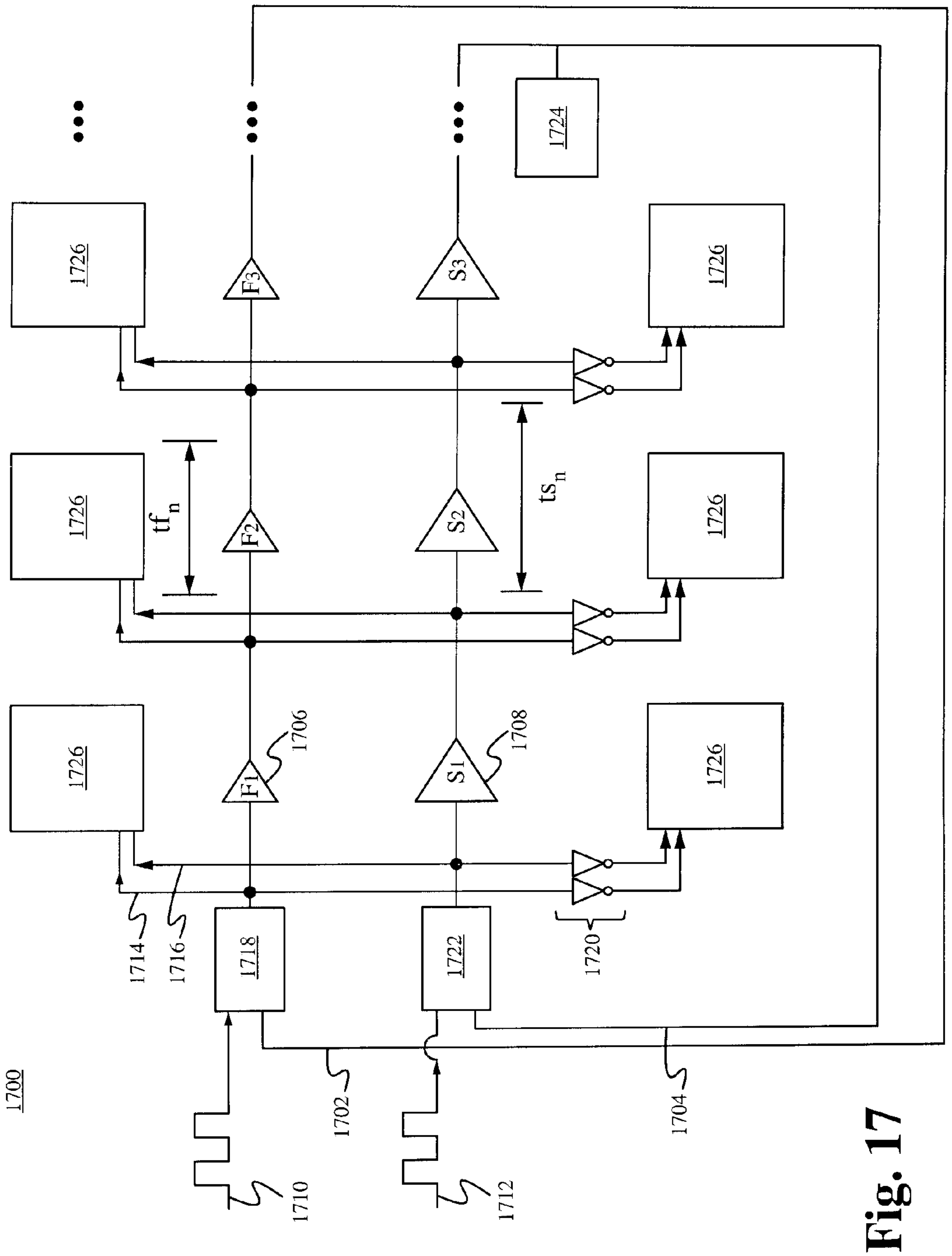
FIG. 17 is directed to a block diagram of an n-dimensional Vernier ring TDC with comparator matrixes in accordance with some embodiments of the present application.

FIG. 17 depicts a block diagram of an n-dimensional Vernier ring TDC with a comparator matrix 1700 of some embodiments. The embodiments described in FIG. 17 are substantially similar to the embodiments described in FIG. 16 except for the differences described herein. The n-dimensional ring TDC with a comparator matrix 1700 comprises a nth delay dimension and a number of (n−1) dimensional Vernier ring TDCs with a comparator matrix 1726. The (n−1) dimensional ring TDCs with a comparator matrix operate in a substantially similar manner as those described with reference to FIGS. 13 and 16. The nth delay dimension comprises a fast delay ring 1702 and a slow delay ring 1704. The fast delay ring 1702 is configured to receive a lag signal 1710 and comprises a fast initiating stage 1718 and one or more fast delay stages 1706 with an adjustable delay interval of $t_{Fn}$. The slow delay ring 1704 is configured to receive a lead signal 1712 and comprises a slow initiating stage 1722, a counter 1724 and one or more slow delay stages 1708 with an adjustable delay interval of $t_{Sn}$. The fast and slow rings 1702, 1704 and their components (e.g., counter 1724) operate in the same manner as the fast and slow rings 1602, 1604 described in reference to FIG. 16. The (n−1) dimensional ring TDCs with a comparator matrix 1726 each have an adjustable delay interval of $t_{nd}$ and comprise a lead signal input 1716 and a lag signal input 1714. In some embodiments, a number of the (n−1) dimensional ring TDCs with a comparator matrix 1726 further comprise a pair of inverters 1720 for inverting the lead and lag signal 1710, 1712 as they are input into the TDCs 1726. Further, the lead signal inputs 1716 are coupled to the slow delay ring 1704 before and after the slow delay stages 1708 and the lag signal inputs 1714 are coupled to the fast delay ring 1702 before and after the fast delay stages 1706. Thus, the minimum scale in the nth dimension is equal to $t_{Sn}-t_{Fn}$, which is also set to equal the detectable range of the (n−1) dimensional ring matrix Vernier TDC 1726 to eliminate the overlap and gap in the TDC output code. Thus, the values $t_{Sn}$ and $t_{Fn}$ are set such that $t_{Sn}-t_{Fn}=t_{nd}$. Accordingly, the nth dimension of delay provided by the next layer of delay rings 1702 and 1704 provides another layer of abstraction to the ring TDC with a comparator matrix that retains all the benefits of the (n−1) dimensional ring TDC with a comparator matrix, but is able to produce an even larger detectable range without sacrificing resolution.

Figure 18:
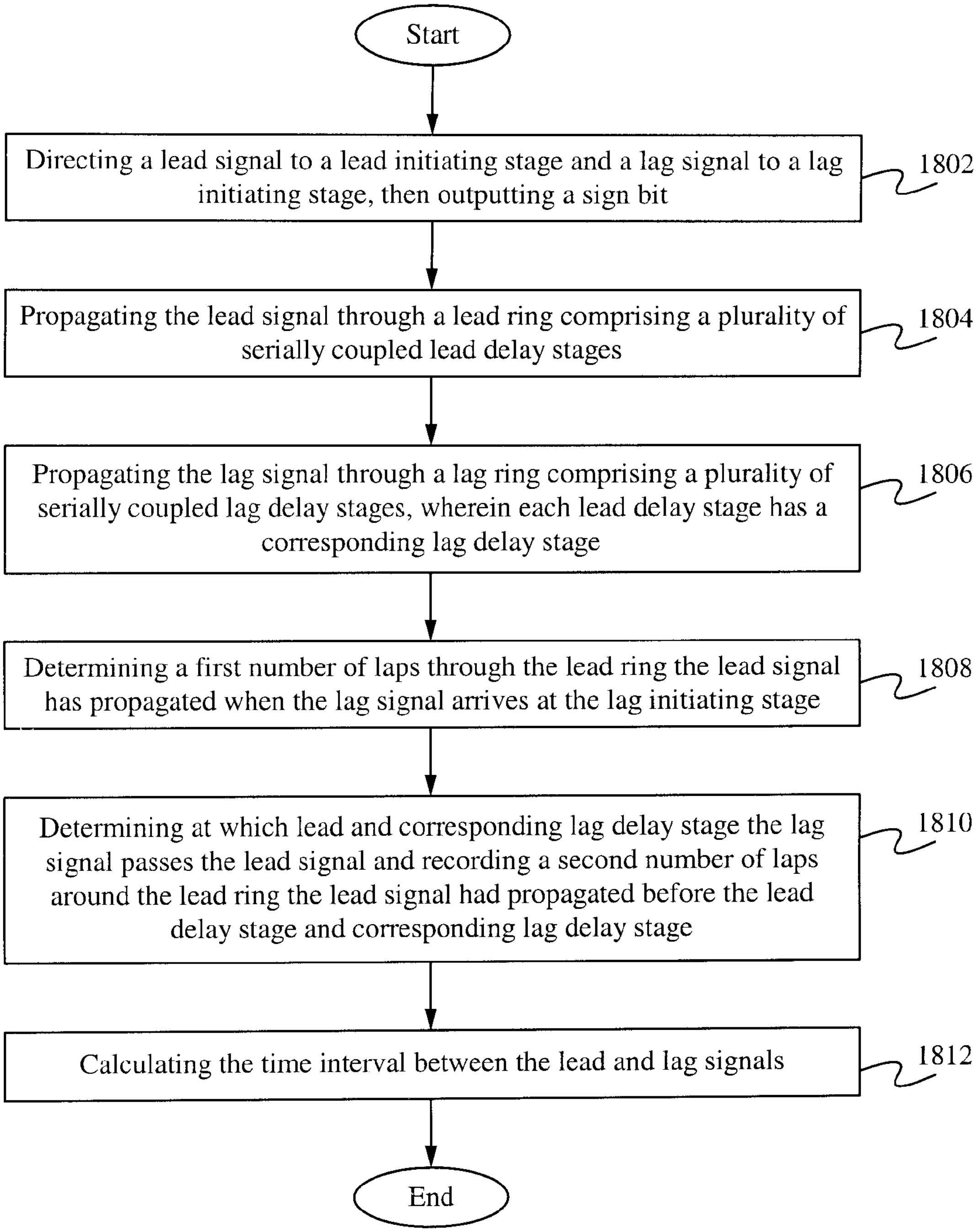
FIG. 18 is directed to a flow chart of the operation of a Vernier ring TDC in accordance with some embodiments of the present application.

The operation of the ring TDC 300 will now be discussed in conjunction with a flow chart illustrated in FIG. 18. In operation, as shown in FIGS. 3 and 4, the pre-logic 412 directs a lead signal 316 to a lead initiating stage 312B and a lag signal 314 to a lag initiating stage 312A, and then outputs a sign bit at the step 1802. In some embodiments, the pre-logic 412 upon receiving a pair of input signals and determines which signal is the lead signal 316 and which signal is the lag signal 314, wherein the lead signal 316 arrives at the pre-logic 412 before the lag signal 314. The lead signal 316 then propagates through a lead ring 304 comprising a plurality of serially coupled lead delay stages 310B at the step 1804. Similarly, the lag signal 314 then propagates through a lag ring 302 comprising a plurality of serially coupled lag delay stages 310A, wherein each lead delay stage 310B has a corresponding lag delay stage 310A at the step 1806. In some embodiments, the last lead delay stage in the series is coupled to an input of the lead initiating stage 312B and the first lead delay stage in the series is coupled to an output of the lead initiating stage 312B in order to form the lead ring 304 and wherein the last lag delay stage in the series is coupled to an input of the lag initiating stage 312A and the first lag delay stage in the series is coupled to an output of the lag initiating stage 312A in order to form the lag ring 302. In some embodiments, each lead delay stage 310B is configured such that it has an adjustable lead propagation delay interval that is greater than an adjustable lag propagation delay interval of each lag delay stage 310A such that after each stage 310A, 310B a lag rising and lag falling edge of the lag signal 314 begins to catch up with a lead rising edge and lead falling edge of the lead signal 316. The coarse counter 408 then determines a first number of laps through the lead ring 304 the lead signal 316 has propagated when the lag signal 314 arrives at the lag initiating stage 312A at the step 1808. In some embodiments, determining a first number of laps through the lead ring 304 the lead signal 316 has propagated when the lag signal 314 arrives at the lag initiating stage 312A comprises incrementing the coarse counter 408 each time the lead signal 316 laps the lead ring 304. Then the thermometer 404 determines at which lead delay stage 310B and corresponding lag delay stage 310A the lag signal 314 passes the lead signal 316 while the fine counter 406 records a second number of laps around the lead ring 304 the lead signal 316 had propagated before reaching the lead delay stage and corresponding lag delay stage 310A, 310B at the step 1810. In some embodiments, the thermometer 404 determines at which lead and corresponding lag stage 310A, 310B the lag signal 314 passes the lead signal 316 by determining an arrival sequence of the lead and lag signals 314, 316 at a plurality of pairs of comparators 318 coupled to each lead stage 310B and the corresponding lag stage 310A. In some embodiments, the thermometer 404 translates the output of the pairs of comparators 318 from thermometer code to binary code. In some embodiments, a counter in the fine counter 406 is incremented each time the lead signal 316 laps the lead ring 304. The evaluation logic 410 then calculates the time interval between the lead and lag signals 316, 314 based on an algorithm at the step 1812. In some embodiments, the algorithm is dependent on at least the first and second numbers of laps. In some embodiments, the lead and lag delay stages are inverters. In some embodiments, the lead and lag initiating stages are NAND gates. In some embodiments, the comparators comprise an arbiter, a D flip-flop or a RS latch. In some embodiments, the lead and lag rings are disconnected after the lag signal 314 passes the lead signal 316 in order to save power. In some embodiments, the time interval calculation results are restored and the whole system is reset such that it is ready for the next measuring cycle.

Figure 19:
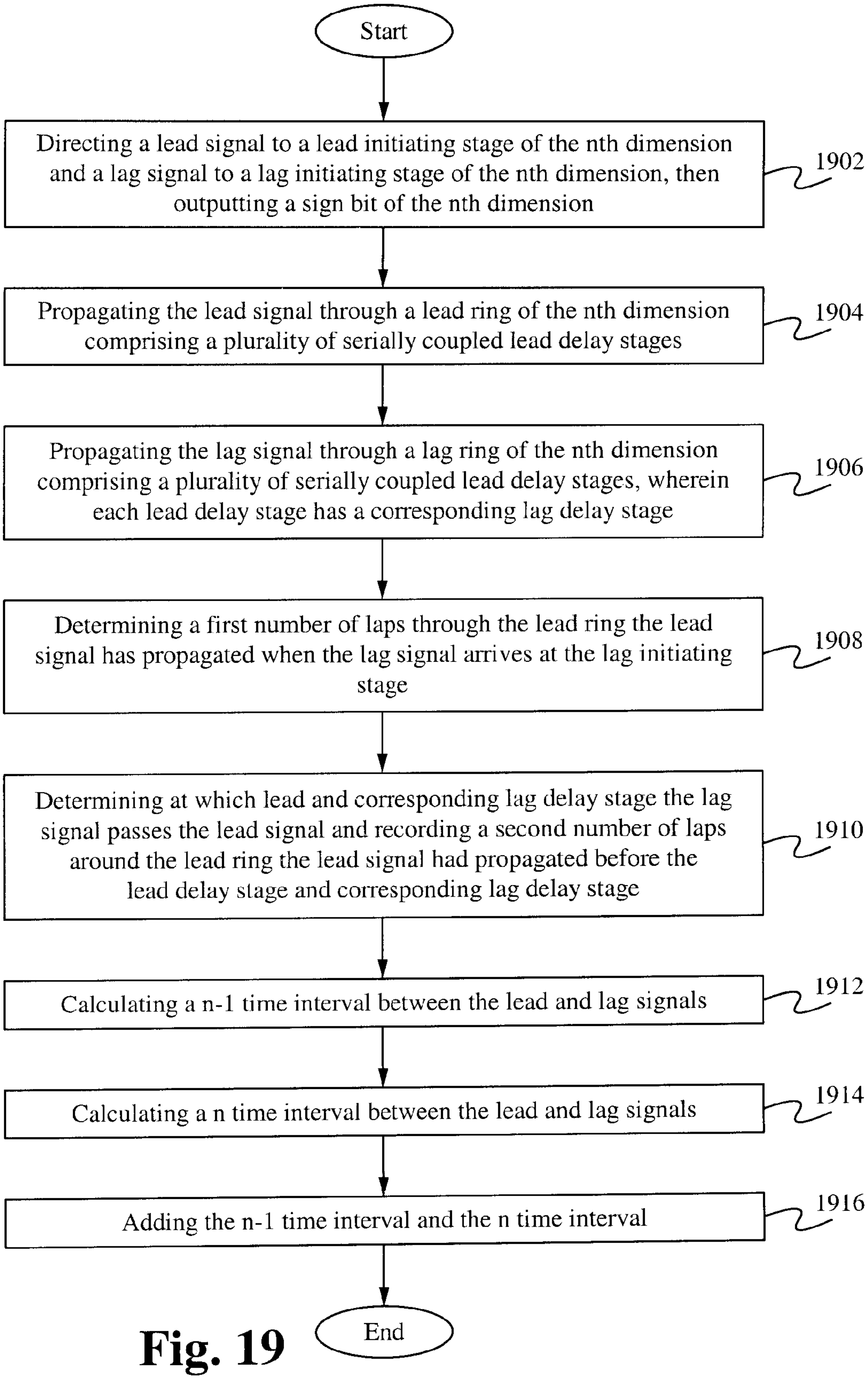
FIG. 19 is directed to a flow chart of the operation of an nth dimensional Vernier ring TDC with comparator matrix in accordance with some embodiments of the present application.

The operation of the nth dimensional ring TDC with a comparator matrix 1700 will now be discussed in conjunction with a flow chart illustrated in FIG. 19. In operation, as shown in FIGS. 13, 16 and 17, a lead signal 1712 is directed to a lead initiating stage 1722 of an nth dimension and a lag signal 1710 is directed to a lag initiating stage 1718 of the nth dimension, and then a sign bit is output of the nth dimension at the step 1902. In some embodiments, a pair of input signals are received and which signal is the lead signal 1712 and which is the lag signal 1710 is determined, wherein the lead signal 1712 arrived before the lag signal 1710. A lead signal 1712 is able to be propagated through a lead ring 1704 of the nth dimension, wherein the lead ring 1704 comprises a plurality of serially coupled lead delay stages 1708 at the step 1904. A lag signal 1710 is then propagated through a lag ring 1702 of the nth dimension, wherein the lag ring 1702 comprises a plurality of serially coupled lag delay stages 1706, wherein each lead delay stage 1708 has a corresponding lag delay stage 1706 at the step 1906. In some embodiments, the last lead delay stage in the series is coupled to an input of the lead initiating stage 1722 and the first lead delay stage in the series is coupled to an output of the lead initiating stage 1722 thereby forming the lead ring 1704 and wherein the last lag delay stage in the series is coupled to an input of the lag initiating stage 1718 and the first lag delay stage in the series is coupled to an output of the lag initiating stage 1718 thereby forming the lag ring 1702. In some embodiments, each lead delay stage 1708 is configured such that it has an adjustable lead propagation delay interval that is greater than an adjustable lag propagation delay interval of each lag delay stage 1706 such that after each stage a lag rising and lag falling edge of the lag signal 1710 begins to catch up with a lead rising and lead falling edge of the lead signal 1712. A first number of laps through the lead ring 1704 that the lead signal 1712 has propagated when the lag signal 1710 arrives at the lag initiating stage 1718 is able to then be determined at the step 1908. In some embodiments, determining a first number of laps through the lead ring 1704 the lead signal 1712 has propagated when the lag signal 1710 arrives at the lag initiating stage 1718 further comprises incrementing a coarse counter each time the lead signal 1712 laps the lead ring 1704. At which lead and corresponding lag delay stage 1706, 1708 the lag signal 1710 passes the lead signal 1712 is then determined and a second number of laps around the lead ring 1704 the lead signal 1712 had propagated before reaching the lead delay stage 1708 and corresponding lag delay stage 1706 is then recorded at the step 1910. In some embodiments, determining at which lead and corresponding lag delay stage 1706, 1708 the lag signal 1710 passes the lead signal 1712 and recording a second number of laps around the lead ring 1704 the lead signal 1712 had propagated before the lead delay stage 1708 and corresponding lag delay stage 1706 further comprises incrementing a fine counter each time the lead signal 1712 laps the lead ring 1704. A n−1 time interval between the lead and lag signals 1710, 1712 based on an n−1 algorithm is then calculated at the step 1912. An n time interval between the lead and lag signals 1710, 1712 based on the n algorithm is then calculated at the step 1914. In some embodiments, the n algorithm is dependent on at least the first and second numbers of laps. Then the n−1 time interval and the n time interval are able to be added at the step 1916. In some embodiments, the lead and lag initiating stages are NAND gates. In some embodiments, the lead and lag delay stages are inverters.

Figure 20:
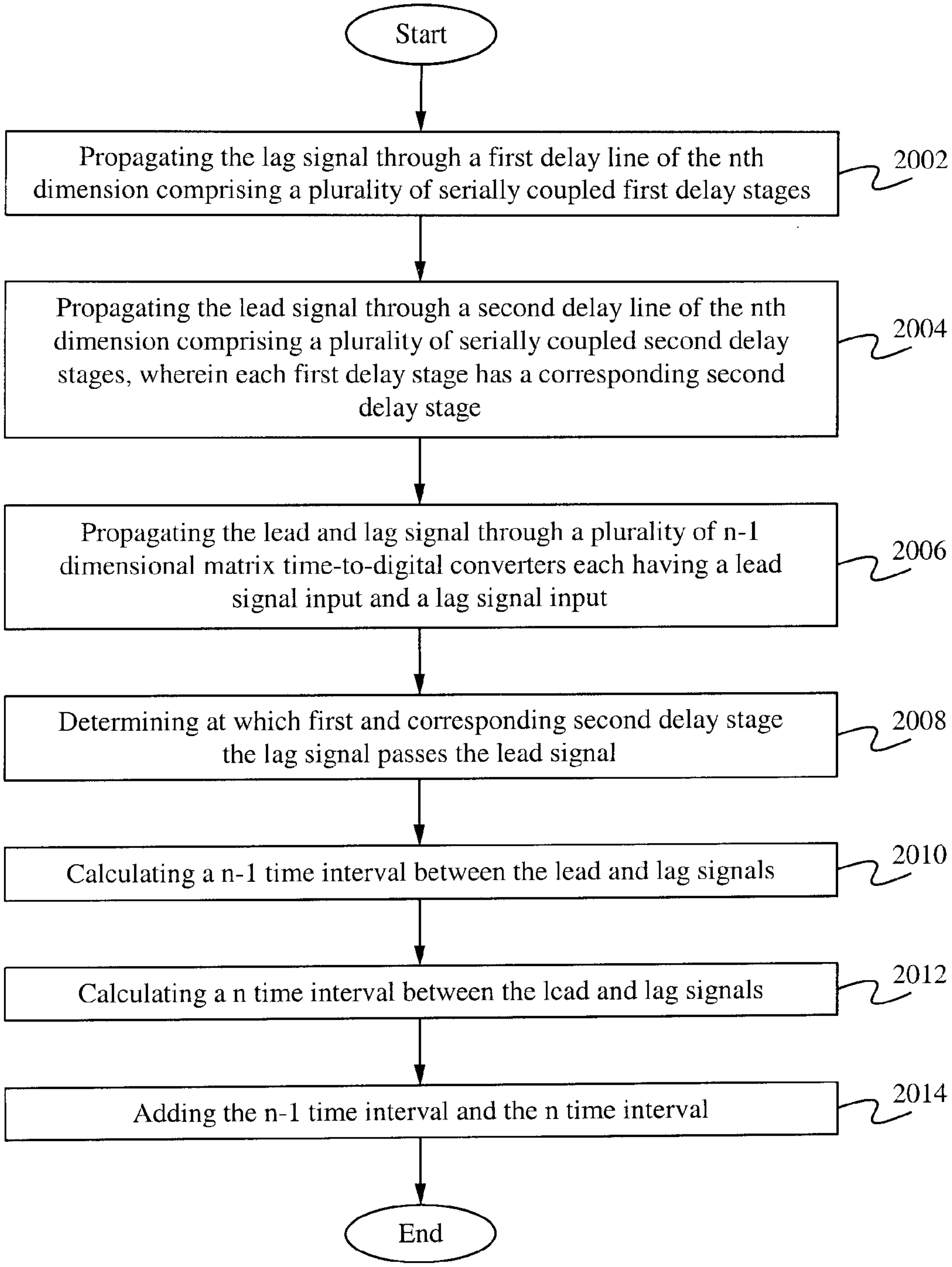
FIG. 20 is directed to a flow chart of the operation of an nth dimensional Vernier TDC with comparator matrix in accordance with some embodiments of the present application.

The operation of the nth dimensional TDC with comparator matrixes 1500 will now be discussed in conjunction with a flow chart illustrated in FIG. 20. In operation, as shown in FIGS. 12, 14 and 15, a lag signal 1512 is propagated through a first delay line 1504 of the nth dimension, wherein the first delay line 1504 comprises a plurality of serially coupled first delay stages 1508 at the step 2002. A lead signal 1514 is propagated through a second delay line 1506 of the nth dimension, wherein the second delay line 1506 comprises a plurality of serially coupled second delay stages 1510, wherein each first delay stage 1508 has a corresponding second delay stage 1510 at the step 2004. In some embodiments, the first and second delay stages 1508, 1510 are inverters. In some embodiments, a pair of input signals are received and it is determined which of the signals is the lead signal 1514 and which is the lag signal 1512, wherein the lead signal 1514 arrived before the lag signal 1512. In some embodiments, each first delay stage 1508 is configured such that it has an adjustable first propagation delay interval that is less than an adjustable second propagation delay interval of each second delay stage 1510 such that after each stage a lag rising and lag falling edge of the lag signal 1512 begins to catch up with a lead rising and lead falling edge of the lead signal 1514. The lead and lag signals 1512, 1514 are then propagated through a plurality of n−1 dimensional matrix time-to-digital converters 1502 each having a lead signal input 1518 and a lag signal input 1516 at the step 2006. At which first delay stage 1508 and corresponding second delay stage 1510 the lag signal 1512 passes the lead signal 1514 is then determined at the step 2008. A n−1 time interval between the lead and lag signals 1512, 1514 based on an n−1 algorithm is then calculated at the step 2010. An n time interval between the lead and lag signals 1512, 1514 based on an n algorithm is calculated at the step 2012. Then the n−1 time interval and the n time interval are added at the step 2014. In some embodiments, the lead signal inputs 1518 are coupled to the second delay line 1506 such that one lead signal input 1518 is coupled before and after each second delay stage 1510, and further the lag signal inputs 1516 are coupled to the first delay line 1504 such that one lag signal input 1516 is coupled before and after each first delay stage 1508.

The ring TDC, TDC with comparator matrixes and ring TDCs with a comparator matrix described herein have numerous advantages. Specifically, the ring TDCs and ring TDCs with a comparator matrix allow for the continued reuse of delay stages with each lap of the lead and lag signals thereby permitting fine resolution without sacrificing a large detectable range. The TDCs with comparator matrixes and ring TDCs with a comparator matrix have the advantage of reusing the delay stages as well as their matrix formation allows the coupling of multiple delay stage outputs to a single comparator. Thus, each type of TDC described herein reduces the amount of delay stages needed for operation. Moreover, Vernier ring TDC, TDCs with comparator matrixes and ring TDCs with a comparator matrix all reduce the amount of power consumed by the TDC, the size of the TDCs and the measuring time required.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications may be made in the embodiment chosen for illustration without departing from the spirit and scope of the invention as defined by the claims.

What is claimed is:

1. A ring time-to-digital converter comprising:

a. a lead initiating stage for receiving a lead step signal and a lag initiating stage for receiving a lag step signal;

b. a plurality of serially coupled lead delay stages for enabling propagation of the lead step signal, wherein a last lead delay stage is coupled to an input of the lead initiating stage and a first lead delay stage is coupled to an output of the lead initiating stage thereby forming a lead ring; and c. a plurality of serially coupled lag delay stages for enabling propagation of the lag step signal, wherein a last lag delay stage is coupled to an input of the lag initiating stage and a first lag delay stage is coupled to an output of the lag initiating stage thereby forming a lag ring;

wherein each lead delay stage has a corresponding lag delay stage.

2. The converter of claim 1 wherein the lead step signal propagates from the lead initiating stage along the lead ring and the lag step signal propagates from the lag initiating stage along the lag ring.

3. The converter of claim 2 wherein each lead delay stage has an adjustable lead propagation delay interval that is greater than an adjustable lag propagation delay interval of each lag delay stage such that after each stage a lag rising and lag falling edge of the lag signal begins to catch up with a lead rising and lead falling edge of the lead signal.

4. The converter of claim 3 further comprising a plurality of comparator pairs, wherein each pair is coupled to a lead output of a lead delay stage and a lag output of the corresponding lag delay stage.

5. The converter of claim 4 wherein the plurality of comparator pairs each comprise an A-type comparator for detecting a lead or lag rising edge and a B-type comparator for detecting a lead or lag falling edge.

6. The converter of claim 5 wherein outputs of the A-type comparators toggle between a logical one and a logical zero when the lag rising edge arrives before the lead rising edge, and outputs of the B-type comparators toggle between a logical one and a logical zero when the lag falling edge arrives before the lead falling edge.

7. The converter of claim 6 wherein the comparators comprise any combination of singled-ended or differential arbiters, flip flops and latches.

8. The converter of claim 7 wherein the delay stages comprise any combination of inverters, buffers and any other type of logic gate.

9. The converter of claim 8 wherein the initiating stages comprise any combination of NAND gates, multiplexers, multi-switches or any other type of logic gate able to initiate the propagation of signals.

10. The converter of claim 3 further comprising a plurality of double-edge-triggered comparators, wherein each comparator is coupled to a lead output of a lead delay stage and a lag output of the corresponding lag delay stage.

11. The converter of claim 10 wherein outputs of the comparators toggle between a logical one and a logical zero when either the lag rising edge arrives before the lead rising edge or the lag falling edge arrives before the lead falling edge.

12. The converter of claim 1 wherein the lead initiating stage comprises one of the lead delay stages and the lag initiating stage comprises one of the lag delay stages such that the lead and lag initiating stages are able to both initiate and delay the lead and lag signals.

13. A ring time-to-digital converter system comprising:

a. a Vernier ring comprising:

i. a lead initiating stage for receiving a lead step signal and a lag initiating stage for receiving a lag step signal;

ii. a plurality of serially coupled lead delay stages for enabling propagation of the lead step signal, wherein a last lead delay stage is coupled to an input of the lead initiating stage and a first lead delay stage is coupled to an output of the lead initiating stage thereby forming a lead ring; and iii. a plurality of serially coupled lag delay stages for enabling propagation of the lag step signal, wherein a last lag delay stage is coupled to an input of the lag initiating stage and a first lag delay stage is coupled to an output of the lag initiating stage thereby forming a lag ring, wherein each lead stage has a corresponding lag stage.

14. The converter system of claim 13 wherein the lead step signal propagates from the lead initiating stage along the lead ring and the lag step signal propagates from the lag initiating stage along the lag ring.

15. The converter system of claim 14 wherein each lead delay stage has an adjustable lead propagation delay interval that is greater than an adjustable lag propagation delay interval of each lag delay stage such that after each stage a lag rising and lag falling edge of the lag signal begins to catch up with a lead rising and lead falling edge of the lead signal.

16. The converter system of claim 15 further comprising a plurality of comparator pairs, wherein each pair is coupled to a lead output of a lead delay stage and a lag output of the corresponding lag delay stage.

17. The converter system of claim 16 wherein the plurality of comparator pairs each comprise an A-type comparator for detecting a lead or lag rising edge and a B-type comparator for detecting a lead or lag falling edge.

18. The converter system of claim 17 wherein outputs of the A-type comparators toggle between a logical one and a logical zero when the lag rising edge arrives before the lead rising edge, and outputs of the B-type comparators toggle between a logical one and a logical zero when the lag falling edge arrives before the lead falling edge.

19. The converter system of claim 15 further comprising a plurality of double-edge-triggered comparators, wherein each comparator is coupled to a lead output of a lead delay stage and a lag output of the corresponding lag delay stage.

20. The converter system of claim 19 wherein outputs of the comparators toggle between a logical one and a logical zero when either the lag rising edge arrives before the lead rising edge or the lag falling edge arrives before the lead falling edge.

21. The converter system of claim 20 further comprising pre-logic coupled to the lead and lag initiating stages for receiving a pair of input signals, determining which input signal arrived first, and outputting the signal that arrived first to the lead initiating stage as the lead signal and the signal that arrived second to the lag initiating stage as the lag signal.

22. The converter system of claim 21 wherein the pre-logic comprises a pre-logic comparator and a pair of multiplexers.

23. The converter system of claim 22 wherein the pre-logic is further coupled to an evaluation logic for outputting a sign bit to the evaluation logic.

24. The converter system of claim 23 further comprising control logic, wherein the control logic resets one of the comparators in each of the pairs of comparators every other time the lead step signal laps the lead ring.

25. The converter system of claim 24 further comprising a fine counter, wherein the fine counter is incremented each time the lead signal laps the lead ring.

26. The converter system of claim 25 further comprising a coarse counter, wherein the coarse counter is incremented each time the lead signal laps the lead ring before the lag signal arrives at the lag initiating stage.

27. The converter system of claim 26 further comprising a thermometer decoder coupled to outputs of the pairs of comparators for translating the output of the pairs of comparators from thermometer code to binary code.

28. The converter system of claim 27 wherein the evaluation logic is coupled to an output of the coarse counter, the fine counter, the thermometer decoder and the sign bit output by the pre-logic, for determining a time interval between the lead signal and the lag signal.

29. A method of measuring a time interval comprising:

a. directing a lead signal to a lead initiating stage and a lag signal to a lag initiating stage, then outputting a sign bit;

b. propagating the lead signal through a lead ring comprising a plurality of serially coupled lead delay stages;

c. propagating the lag signal through a lag ring comprising a plurality of serially coupled lag delay stages, wherein each lead delay stage has a corresponding lag delay stage;

d. determining a first number of laps through the lead ring the lead signal has propagated when the lag signal arrives at the lag initiating stage;

e. determining at which lead delay stage and corresponding lag delay stage the lag signal passes the lead signal and recording a second number of laps around the lead ring the lead signal has propagated before the lead delay stage and corresponding lag delay stage; and f. calculating the time interval between the lead and lag signals.

30. The method of claim 29 further comprising receiving a pair of input signals and determining the lead signal and the lag signal, wherein the lead signal arrived before the lag signal.

31. The method of claim 29 wherein the last lead delay stage in the series is coupled to an input of the lead initiating stage and the first lead delay stage in the series is coupled to an output of the lead initiating stage thereby forming the lead ring and wherein the last lag delay stage in the series is coupled to an input of the lag initiating stage and the first lag delay stage in the series is coupled to an output of the lag initiating stage thereby forming the lag ring.

32. The method of claim 31 wherein each lead delay stage has an adjustable lead propagation delay interval that is greater than an adjustable lag propagation delay interval of each lag delay stage such that after each stage a lag rising and lag falling edge of the lag signal begins to catch up with a lead rising and lead falling edge of the lead signal.

33. The method of claim 29 wherein the determining at which lead and corresponding lag stage the lag signal passes the lead signal comprises determining an arrival sequence of the lead and lag signals at a plurality of pairs of comparators coupled to each lead stage and the corresponding lag stage.

34. The method of claim 33 further comprising control logic, wherein the control logic resets one of the comparators in each of the plurality of pairs of comparators every other time the lead step signal laps the lead ring.

35. The method of claim 31 wherein determining a first number of laps through the lead ring the lead signal has propagated when the lag signal arrives at the lag initiating stage further comprising incrementing a coarse counter each time the lead signal laps the lead ring.

36. The method of claim 31 wherein determining at which lead and corresponding lag stage the lag signal passes the lead signal and recording a second number of laps around the lead ring the lead signal had propagated before the lead delay stage and corresponding lag delay stage further comprises incrementing a fine counter each time the lead signal laps the lead ring.

37. The method of claim 33 further comprising translating an output of the pairs of comparators from thermometer code to binary code with a thermometer decoder.

38. The method of claim 37 further comprising disconnecting the lead ring and the lag ring after the lag signal passes the lead signal.

39. A time-to-digital converter comprising:

a. a plurality of first delay lines comprising a plurality of serially coupled first delay stages;

b. a plurality of second delay lines comprising a plurality of serially coupled second delay stages, wherein each first delay line has a corresponding second delay line;

c. a plurality of comparators wherein each comparator is coupled to a first output of one of the first delay stages from one of the first delay lines and a second output of one of the second delay stages from the corresponding second delay lines thereby forming a plurality of matrixes; and d. a third delay line comprising a plurality of serially coupled third delay stages, wherein each of the third delay stages is coupled between inputs of the plurality of second delay lines and each of the matrixes.

40. The converter of claim 39 wherein the first delay stages are sequentially numbered along the first line and second delay stages are sequentially numbered along the second line.

41. The converter of claim 40 wherein each matrix comprises a plurality of comparator columns wherein a first column of the plurality of columns comprises a plurality of first comparators wherein each first comparator is coupled to the output of a first delay stage having a first number and the output of a second delay stage of an equal number, and further wherein a second column of the plurality of columns comprises a plurality of second comparators wherein each second comparator is coupled to the output of a first delay stage having a second number and the output of a second delay stage having a number that is greater than the second number by one.

42. The converter of claim 41 wherein an nth column of the plurality of columns comprises a plurality of nth comparators wherein each nth comparator is coupled to the output of a first delay stage having a third number and the output of a second delay stage having an nth number that is greater than the third number by $(n-1)$.

43. The converter of claim 42 wherein the first delay stages have an adjustable first delay interval, the second delay stages have an adjustable second delay interval and the third delay stages have an adjustable third delay interval, and further wherein the first delay interval is less than the second delay interval which is less than the third delay interval.

44. The converter of claim 43 wherein the third delay interval is equal to the second delay interval multiplied by the number of second delay stages in one of the plurality of second delay lines minus the first delay interval multiplied by the number of first delay stages in one of the plurality of first delay lines.

45. The converter of claim 44 wherein the second delay interval is equal to the difference between the first and second delay intervals multiplied by the number of first delay stages in one of the plurality of first delay lines.

46. The converter of claim 45 wherein the third delay line and the initial one of the second delay lines are configured to receive a lead signal, and the first delay lines are configured to receive a lag signal, wherein the lead signal is ahead of the lag signal.

47. The converter of claim 46 wherein the remainder of the second delay lines are configured to receive the lead signal as the lead signal propagates through each third stage of the third delay line.

48. A time-to-digital converter comprising:

a. a lead initiating stage for receiving a lead step signal and a lag initiating stage for receiving a lag step signal;

b. a plurality of serially coupled lead delay stages, wherein a last lead delay stage is coupled to an input of the lead initiating stage and a first lead delay stage is coupled to an output of the lead initiating stage thereby forming a lead ring; and c. a plurality of serially coupled lag delay stages, wherein a last lag delay stage is coupled to an input of the lag initiating stage and a first lag delay stage is coupled to an output of the lag initiating stage thereby forming a lag ring;

d. a plurality of comparators wherein each comparator is coupled to a lag output of one of the lag delay stages and a lead output of one of the lead delay stages thereby forming a matrix; and e. a lap counter configured to count the number of laps that the lead signal has propagated through the lead ring before the lag signal passes the lead signal and before the lag signal arrives at the lag initiating stage.

49. The converter of claim 48 wherein the initiating stages comprise any combination of NAND gates, multiplexers, multi-switches or any other type of logic gate able to initiate the propagation of signals.

50. The converter of claim 48 wherein the delay stages comprise any combination of single-ended or differential inverters, buffers or any other type of logic gate able to delay and/or toggle the propagating signals.

51. The converter of claim 48 wherein the comparators comprise any combination of single-ended or differential arbiters, flip flops, latches or any other type of comparator.

52. The converter of claim 48 wherein the lag delay stages are sequentially numbered along the lag ring and lead delay stages are sequentially numbered along the lead ring.

53. The converter of claim 52 wherein the matrix comprises a plurality of comparator columns wherein a first column of the plurality of columns comprises a plurality of first comparators wherein each first comparator is coupled to the output of a lag delay stage having a first number and the output of a lead delay stage of an equal number, and further wherein a second column of the plurality of columns comprises a plurality of second comarators wherein each second comparator is coupled to the output of a lag delay stage having a second number and the output of a lead delay stage having a number that is greater than the second number by one.

54. The converter of claim 53 wherein an nth column of the plurality of columns comprises a plurality of nth comparators wherein each nth comparator is coupled to the output of a lag delay stage having a third number and the output of a lead delay stage having an nth number that is greater than the third number by (n−1).

55. The converter of claim 54 wherein each lead delay stage has an adjustable lead propagation delay interval that is greater than an adjustable lag propagation delay interval of each lag delay stage such that after each stage a lag rising and lag falling edge of the lag signal begins to catch up with a lead rising and lead falling edge of the lead signal.

56. The converter of claim 55 wherein the lead propagation delay interval is equal to the difference between the lead and lag propagation delay intervals multiplied by the number of lag delay stages in the lag delay ring.

57. The converter of claim 56 wherein the lead initiating stage comprises one of the lead delay stages and the lag initiating stage comprises one of the lag delay stages such that the lead and lag initiating stages are able to both initiate and delay the lead and lag signals.

58. The converter of claim 57 wherein the comparators are grouped in order to form a plurality of comparator pairs, and further wherein both comparators in each comparator pair are coupled to the same lag output of one of the lag delay stages and the same lead output of one of the lead delay stages thereby forming the matrix.

59. The converter of claim 58 wherein the plurality of comparator pairs each comprise an A-type comparator for detecting the lead or lag rising edge and a B-type comparator for detecting the lead or lag falling edge.

60. The converter of claim 59 wherein outputs of the A-type comparators toggle between a logical one and a logical zero when the lag rising edge arrives before the lead rising edge, and outputs of the B-type comparators toggle between a logical one and a logical zero when the lag falling edge arrives before the lead falling edge.

61. The converter of claim 57 further comprising a second lap counter, wherein the second lap counter is configured to count the number of laps that the lag signal has propagated through the lag ring before the lag signal passes the lead signal.

62. The converter of claim 57 further comprising a plurality of double-edge-triggered comparators, wherein each comparator is coupled to a lead output of a lead delay stage and a lag output of the corresponding lag delay stage.

63. The converter of claim 62 wherein outputs of the comparators toggle between a logical one and a logical zero when either the lag rising edge arrives before the lead rising edge or the lag falling edge arrives before the lead falling edge.

64. An n-dimensional time-to-digital converter with comparator matrixes comprising:

a. a first delay line of an nth dimension comprising a plurality of serially coupled first delay stages;

b. a second delay line of the nth dimension comprising a plurality of serially coupled second delay stages; and c. a plurality of n−1 dimensional time-to-digital converters with comparator matrixes each having a lead signal input and a lag signal input;

wherein the lead signal inputs are coupled to the second delay line such that one lead signal input is coupled before and after each second delay stage, and further wherein the lag signal inputs are coupled to the first delay line such that one lag signal input is coupled before and after each first delay stage.

65. The converter of claim 64 wherein the first delay stages have an adjustable first delay interval, the second delay stages have an adjustable second delay interval, and further wherein the first delay interval is less than the second delay interval.

66. The converter of claim 65 wherein the n−1 dimensional converters further comprise an n−1 delay interval, wherein the n−1 delay interval is equal to the difference between the first interval and the second interval.

67. An n-dimensional ring time-to-digital converter with a comparator matrix comprising:

a. a lead initiating stage of an nth dimension for receiving a lead step signal and a lag initiating stage of the nth dimension for receiving a lag step signal;

b. a plurality of serially coupled lead delay stages of the nth dimension, wherein a last lead delay stage is coupled to an input of the lead initiating stage and a first lead delay stage is coupled to an output of the lead initiating stage thereby forming a lead ring; and c. a plurality of serially coupled lag delay stages of the nth dimension, wherein a last lag delay stage is coupled to an input of the lag initiating stage and a first lag delay stage is coupled to an output of the lag initiating stage thereby forming a lag ring;

d. a lap counter of an nth dimension configured to count a number of laps that the lead step signal has propagated through the lead ring before the lag signal passes the lead signal and before the lag signal arrives at the lag initiating stage; and e. a plurality of n−1 dimensional ring time-to-digital converters with a comparator matrix each having a lead signal input and a lag signal input;

wherein the lead signal inputs are coupled to the lead delay line such that one lead signal input is coupled before and after each lead delay stage, and further wherein the lag signal inputs are coupled to the lag delay line such that one lag signal input is coupled before and after each lag delay stage.

68. The converter of claim 67 wherein the lag delay stages have an adjustable lag delay interval, the lead delay stages have an adjustable lead delay interval, and further wherein the lag delay interval is less than the lead delay interval.

69. The converter of claim 68 wherein the n−1 dimensional ring time-to-digital converters with a comparator matrix further comprise an n−1 delay interval, wherein the n−1 delay interval is equal to the difference between the lag interval and the lead interval.

70. A method of measuring a time interval comprising:

a. directing a lead signal to a lead initiating stage of the nth dimension and a lag signal to a lag initiating stage of the nth dimension, then outputting a sign bit of the nth dimension;

b. propagating the lead signal through a lead ring of the nth dimension comprising a plurality of serially coupled lead delay stages;

c. propagating the lag signal through a lag ring of the nth dimension comprising a plurality of serially coupled lag delay stages, wherein each lead delay stage has a corresponding lag delay stage;

d. determining a first number of laps through the lead ring the lead signal has propagated when the lag signal arrives at the lag initiating stage;

e. determining at which lead and corresponding lag delay stage the lag signal passes the lead signal and recording a second number of laps around the lead ring the lead signal has propagated before the lead delay stage and corresponding lag delay stage;

f. calculating a n−1 time interval between the lead and lag signals;

g. calculating a n time interval between the lead and lag signals; and h. adding the n−1 time interval and the n time interval.

71. The method of claim 70 wherein the last lead delay stage in the series is coupled to an input of the lead initiating stage and the first lead delay stage in the series is coupled to an output of the lead initiating stage thereby forming the lead ring and wherein the last lag delay stage in the series is coupled to an input of the lag initiating stage and the first lag delay stage in the series is coupled to an output of the lag initiating stage thereby forming the lag ring.

72. The method of claim 71 wherein each lead delay stage has an adjustable lead propagation delay interval that is greater than an adjustable lag propagation delay interval of each lag delay stage such that after each stage a lag rising and lag falling edge of the lag signal begins to catch up with a lead rising and lead falling edge of the lead signal.

73. The method of claim 70 wherein determining a first number of laps through the lead ring the lead signal has propagated when the lag signal arrives at the lag initiating stage further comprises incrementing a coarse counter each time the lead signal laps the lead ring.

74. The method of claim 70 wherein determining at which lead and corresponding lag stage the lag signal passes the lead signal and recording a second number of laps around the lead ring the lead signal had propagated before the lead delay stage and corresponding lag delay stage further comprises incrementing a fine counter each time the lead signal laps the lead ring.

75. The method of claim 70 further comprising disconnecting the lead ring and the lag ring after the lag signal passes the lead signal.

76. A method of measuring a time interval comprising:

a. propagating the lag signal through a first delay line of the nth dimension comprising a plurality of serially coupled first delay stages;

b. propagating the lead signal through a second delay line of the nth dimension comprising a plurality of serially coupled second delay stages, wherein each first delay stage has a corresponding second delay stage;

c. propagating the lead and lag signal through a plurality of n−1 dimensional matrix time-to-digital converters each having a lead signal input and a lag signal input;

d. determining at which first and corresponding second delay stage the lag signal passes the lead signal;

e. calculating a n−1 time interval between the lead and lag signals;

f. calculating a n time interval between the lead and lag signals; and g. adding the n−1 time interval and the n time interval.

wherein the lead signal inputs are coupled to the second delay line such that one lead signal input is coupled before and after each second delay stage, and further wherein the lag signal inputs are coupled to the first delay line such that one lag signal input is coupled before and after each first delay stage.

77. The method of claim 76 wherein each first delay stage has an adjustable first propagation delay interval that is less than an adjustable second propagation delay interval of each second delay stage such that after each stage a lag rising and lag falling edge of the lag signal begins to catch up with a lead rising and lead falling edge of the lead signal.

78. A method of measuring a time interval comprising:

a. directing a lead signal to a lead initiating stage and a lag signal to a lag initiating stage, then outputting a sign bit;

b. propagating the lead signal through a lead ring comprising a plurality of serially coupled lead delay stages;

c. propagating the lag signal through a lag ring comprising a plurality of serially coupled lag delay stages, wherein each lead delay stage has a corresponding lag delay stage;

d. detecting at which lap of propagation the lag signal passes the lead signal;

e. determining a number of laps through the lead ring the lead signal has propagated and a number of laps through the lag ring the lag signal has propagated before the lag signal has passed the lead signal;

f. disconnecting the lead ring and lag ring before a next lap starts after at least one converter detects that the lag signal has passed the lead signal;

g. determining at which lead delay stage and corresponding lag delay stage the lag signal passes the lead signal by comparing results of a comparator matrix;

h. calculating the time interval between lead signal and lag; and i. restoring calculation results and resetting the system to be ready for the next measuring cycle.

79. The method of claim 78 further comprising control logic, wherein the control logic resets one of the comparators in each of the plurality of pairs of comparators every other time the lead step signal laps the lead ring.

* * * * *

UNITED STATES PATENT AND TRADEMARK OFFICE

CERTIFICATE OF CORRECTION

PATENT NO. : 8,138,958 B2
APPLICATION NO. : 12/697111
DATED : March 20, 2012
INVENTOR(S) : Fa Foster Dai and Jianjun Yu It is certified that error appears in the above-identified patent and that said Letters Patent is hereby corrected as shown below:

In the Specification:

At column 1, lines 19-27, please delete:

"U.S. GOVERNMENT AGENCY AND THE GOVERNMENT CONTRACT

The invention was partially funded by an agency of the United States Government or under a contract with an agency of the United States Government. The name of the U.S. Government agency and the Government contract number are: Army Research Laboratory under Contract No. W911 QX-05-C-0003."

Signed and Sealed this
Eighth Day of March, 2016

Michelle K. Lee

Michelle K. Lee
*Director of the United States Patent and Trademark Office*